(12) United States Patent
Sakaguchi et al.

(10) Patent No.: US 7,091,667 B2
(45) Date of Patent: Aug. 15, 2006

(54) THIN FILM TRANSISTOR ARRAY, DISPLAY PANEL, METHOD FOR INSPECTING THE THIN FILM TRANSISTOR ARRAY, AND METHOD FOR MANUFACTURING ACTIVE MATRIX ORGANIC LIGHT EMITTING DIODE PANEL

(75) Inventors: Yoshitami Sakaguchi, Hadano (JP); Daiju Nakano, Sagamihara (JP)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 10/952,302

(22) Filed: Sep. 28, 2004

(65) Prior Publication Data

US 2005/0067943 A1    Mar. 31, 2005

(30) Foreign Application Priority Data

Sep. 30, 2003    (JP)    ............................. 2003-340018

(51) Int. Cl.
*G09G 3/10*    (2006.01)
(52) U.S. Cl. ................. 315/169.1; 315/169.3; 345/45; 345/46; 345/92; 313/500
(58) Field of Classification Search .. 315/169.1–169.3; 345/44–46, 56, 90, 92; 349/41, 42, 48; 257/72, 257/E27.116, E29.151; 313/498, 500
See application file for complete search history.

(56) References Cited

U.S. PATENT DOCUMENTS

| 6,340,963 B1 * | 1/2002 | Anno et al. ................. 345/92 |
| 6,674,136 B1 * | 1/2004 | Ohtani ........................ 257/408 |
| 6,909,114 B1 * | 6/2005 | Yamazaki .................... 257/66 |
| 2003/0133054 A1 * | 7/2003 | Taguchi et al. .............. 349/38 |
| 2004/0160167 A1 * | 8/2004 | Arai et al. ................... 313/500 |

FOREIGN PATENT DOCUMENTS

| JP | 2002-244617 | 8/2002 |
| JP | 2002-278497 | 9/2002 |
| JP | 2002-328627 | 11/2002 |

OTHER PUBLICATIONS

A Polysilicon Active Matrix Organic Light Wmitting Diode Display with Integrated Drivers: Dawson et al. -1999 SID International Symposium, May 18-20, 1999:pp. 438-441.
Invited Paper: Pursuit of Active Matrix Organic Light Emitting Diode Displays: R.M.A. Dawson and M.G. Kane—2001 SID International Symposium Jun. 5-7, 2001; pp. 372-375.
A 6x6-in 20-lpi Electroluminescent Display Panel:P.P. Brody et al; IEEE Trans actions on Electron Devices, vol. ED-22, No. 9, pp. 739-748, Sep. 1975.

* cited by examiner

*Primary Examiner*—Haissa Philogene
(74) *Attorney, Agent, or Firm*—Scully, Scott, Murphy & Presser, P.C.; Marion Underweiser, Esq.

(57) ABSTRACT

A thin film transistor (TFT) array comprises: a drive TFT for driving an organic light emitting diode (OLED), which is an electroluminescence (EL) device; first common wiring disposed for performing a current source or a current sink for the OLED; second common wiring disposed for performing a current source or a current sink for the OLED, the second common wiring being connected alternately with the first common wiring for each horizontal line and each vertical column of a pixel; and a switching TFT, which is a connection switch for connecting either one of the first common wiring and the second common wiring to a pixel electrode.

19 Claims, 23 Drawing Sheets

PRIOR ART

THIN FILM TRANSISTOR ARRAY, DISPLAY PANEL, METHOD FOR INSPECTING THE THIN FILM TRANSISTOR ARRAY, AND METHOD FOR MANUFACTURING ACTIVE MATRIX ORGANIC LIGHT EMITTING DIODE PANEL

BACKGROUND OF THE INVENTION

The present invention relates to a display panel or the like using organic electroluminescence (EL), inorganic EL or the like, and more specifically, to an EL display panel using an active matrix system, and the like.

Among display panels, an EL panel using organic EL or inorganic EL has received very much attention in recent years. An EL device is a chemical substance in which a material thereof emits light by being energized. The EL device can obtain a different emitted color by changing a chemical structure, and a research on utilizing the EL device for a display panel has been progressed. In the EL device, the organic EL, hereinafter, referred to as an OLED (organic light emitting diode), is one emitting light in a manner that a direct current is flown through a fluorescent organic compound excited by application of an electric field. The organic EL has received attention as a next-generation display device in terms of its thin thickness, wide viewing angle, wide gamut and the like. In a drive method of this OLED, a passive type and an active type are present, and in order to realize a large screen and high definition display, the active type is suitable in terms of material, lifetime and crosstalk. In this active type, generally, a TFT (thin film transistor) drive method is adopted.

For a pixel circuit of an active matrix OLED (AMOLED), a variety of configurations have been proposed in papers and the like. FIGS. 23(a) to 23(d) are diagrams showing examples of a variety of pixel circuits for the OLED. FIG. 23(a) shows a voltage programming circuit composed of two TFTs, which is proposed by Brody [Brody et al, "A 6×6 inch 20 lpi Electroluminescent Display Panel", IEEE Trans. Elec. Dev., Vol. ED-22, pp. 739–748 (1975)]. This is a mainstream configuration at present. FIG. 23(b) shows a voltage programming circuit composed of four TFTs, which is added with a Vth compensation function and proposed by Dawson [Dawson et al., "A Poly-Si Active-Matrix OLED Display with Integrated Drivers," Digest of Technical Papers Volume XXX, 1999 SID International Symposium, pp. 438–441; "Pursuit of Active Matrix Organic Light Emitting Diode Displays," Digest of Technical Papers Volume XXXII, 2001 SID International Symposium, pp. 372–375]. FIG. 23(c) shows another current programming circuit composed of four TFTs, which is added with the Vth compensation function and proposed by Dawson. Moreover, FIG. 23(d) shows current programming circuit composed of four TFTs of a current mirror system. In each of the variety of pixel circuits shown in FIGS. 23(a) to 23(d), a drive TFT denoted by a reference symbol T2 (p) is used, and an OLED is connected thereto. Moreover, a power source is supplied to each pixel circuit through common wiring denoted by a reference symbol Vdd.

As a background art described in a gazette, for example, there is a technology in which switch means is inserted between a light-emitting device and current supply means in order to reduce power consumption of a display panel using current control-type light-emitting device represented by the organic EL device and the like, e.g., refer to Gazette of Japanese Patent Laid-Open No. 2002-278497 (p. 4, FIG. 3). Moreover, in order to prevent an occurrence of a residual image in the organic EL device, for example, there is a technology in which a TFT for connecting a potential of a pixel electrode to a negative power source and a TFT for resetting a pixel capacity are added, thus making it possible to turn off the organic EL device before programming, e.g., refer to Gazette of Japanese Patent Laid-Open No. 2002-244617 (pp. 3 to 4, FIG. 1). Furthermore, for example, in a liquid crystal display panel and the like, there is disclosed a technology of inspecting lighting of pixels in a manner that common wiring is separated into two lines, short-circuit wiring short-circuiting each of the common wiring and short-circuit wiring short-circuiting all of segment wiring are formed in advance, and a drive voltage is applied to each pixel through each of these pieces of wiring, e.g., refer to Gazette of Japanese Patent Laid-Open No. 2002-328627 (p. 3, FIG. 1).

Here, a manufacturing process of the active matrix OLED (AMOLED) is broadly divided into an array step of creating a TFT array and a cell step of forming the OLED on the array. If the TFT array can be inspected after the array step, a defective TFT array can be prevented from flowing out to the cell step, and a reduction of manufacturing cost can be expected. In the pixel circuit of the AMOLED, as shown in FIGS. 23(a) to 23(d), there is a drive TFT (T2(p)) shown in FIGS. 23(a) to (d)) for driving the OLED, and characteristic variations of this drive TFT give serious and negative effects on image quality of an AMOLED panel. Accordingly, it is desired to perform a characteristic inspection of this drive TFT before forming the OLED. However, since the OLED is not connected to the drive TFT in the pixel circuit before forming of the OLED and the drive TFT becomes an open drain or an open source, a current path is not present in the drive TFT. Accordingly, a current cannot be flown to the drive TFT, and the characteristic inspection is also very difficult.

In each of JP2002-278497 and JP2002-244617 described above, the TFT is added to the pixel circuit, and thus an additional function other than an original image display function is realized. However, in the technology described in JP2002-278497 described above, only a mechanism of controlling emission duty in display is realized, and this cannot be utilized for the inspection of the drive TFT. Moreover, in the technology described in JP2002-244617 described above, the drive TFT is forcibly fixed to an OFF state when the proposed function is used, and this cannot be applied to the purpose of the inspection. Furthermore, although the technology described in JP2002-328627 described above has a point similar to a configuration of the present invention to be described later in that the common wiring is separated into two lines, the technology does not have any related technical portion other than the above, and cannot be utilized for the inspection of the drive TFT for driving the EL device.

SUMMARY OF THE INVENTION

The present invention has been created in order to solve such technical problems described above. It is an object of the present invention to enable a characteristic inspection of a drive TFT without introducing new inspecting wiring.

It is another object of the present invention to reduce an influence of wiring on layout of a pixel circuit and to restrict a reduction of an emission area of each pixel.

It is still another object of the present invention to simply measure a variety of characteristics of the drive TFT by a TFT array on a standalone basis in an OLED panel.

On the basis of such objects, in the present invention, wiring (usually, referred to as common wiring) for connecting a power source or a GND to a pixel electrode is separated into two lines. Moreover, to each pixel circuit, a TFT playing a role of a connection switch between the pixel electrode and the common wiring is added. Thus, a current path for supplying the power source from the common wiring to the other common wiring is ensured, thus making it possible to observe a current flowing in the drive TFT on the common wiring. Specifically, a TFT array to which the present invention is applied comprises: a drive TFT for driving an EL device; first common wiring disposed for performing a current source or a current sink for the EL device; second common wiring disposed for performing a current source or a current sink for the EL device, the second common wiring being connected alternately with the first common wiring for each horizontal line or each vertical column of a pixel; and a connection switch for connecting either one of the first common wiring and the second common wiring to a pixel electrode.

Here, the TFT array can further comprise select wiring for selecting the pixel, characterized in that the connection switch is composed of a TFT, and ON/OFF control of the TFT is performed by use of the select wiring. Moreover, the TFT array can be characterized in that the ON/OFF control of the TFT is performed by use of select wiring prepared for selecting a pixel other than a pixel in which ON/OFF control of this TFT is performed. Furthermore, the TFT array can be characterized in that this connection switch includes a diode, and a polarity of a terminal of the diode, the terminal being connected to the pixel electrode, coincides with a polarity of a terminal of the EL device, the terminal being connected to the pixel electrode. Still further, the TFT array can be characterized in that this connection switch is composed of a plurality of TFTs connected in series, and ON/OFF control of this plurality of TFTs is performed by use of a pair of select wiring prepared for selecting a pixel in which the ON/OFF control of the TFTs is performed and select wiring prepared for selecting a pixel other than the pixel or the select wiring prepared for selecting the pixel other than the pixel in which the ON/OFF control of the TFTs is performed.

One aspect of the present invention relates to a TFT array comprising: a drive TFT for driving an EL device; first common wiring disposed for performing a current source or a current sink for the EL device; second common wiring disposed for performing a current source or a current sink for the EL device, the second common wiring being connected alternately with this first common wiring for each horizontal line or each vertical column of a pixel; and means for enabling an inspection of the drive TFT by supplying a high potential to either one of the first common wiring and the second common wiring and a low potential to the other.

Here, after performing a current measurement of the drive TFT in a pixel in an odd-numbered array or an even-numbered array, this means for enabling an inspection of the drive TFT mutually switches the potentials of the first common wiring and second common wiring, and enables a current measurement of the drive TFT in a pixel in the other of the odd-numbered array and the even-numbered array. Moreover, this means for enabling an inspection of the drive TFT enables the inspection of the drive TFT while alternately switching the potential of the first common wiring and the potential of the second common wiring for each pixel inspection.

Meanwhile, a display panel to which the present invention is applied comprises: an EL device; a drive TFT for driving this EL device; first common wiring disposed for performing a current source or a current sink for the EL device; second common wiring disposed for performing a current source or a current sink for the EL device, the second common wiring being connected alternately with the first common wiring for each horizontal line or each vertical column of a pixel; and a connection switch for connecting either one of the first common wiring and the second common wiring to a pixel electrode.

Here, the display panel is characterized in that this connection switch is composed of a single TFT or a plurality of TFTs connected in series, and ON/OFF control is performed therefor by use of a select line for selecting a pixel. Moreover, the display panel is characterized in that the ON/OFF control of the TFT composing the connection switch is performed by use of the select line prepared for selecting the pixel in which the ON/OFF control of the TFT is performed and/or the select line prepared for selecting a pixel other than the pixel. Furthermore, the display panel can be characterized in that this connection switch includes a diode, and a polarity of a terminal of the diode, the terminal being connected to the pixel electrode, coincides with a polarity of a terminal of the EL device, the terminal being connected to the pixel electrode. Still further, the display panel can be characterized in that these first common wiring and second common wiring are supplied with potentials equal to each other at a time of a normal operation performing image display.

Another aspect of the present invention relates to a method for inspecting a TFT array including a drive TFT for driving an EL device, in which common wiring to be implemented therein is separated into first common wiring and second common wiring, and the first common wiring and the second common wiring are connected alternately with each other for each horizontal line or each vertical column. The method is characterized in that a high potential is supplied to either one of the first common wiring and the second common wiring, and a low potential is supplied to the other, and a drive current flowing in the drive TFT from the one of the first common wiring and the second common wiring to the other is measured on the common wiring. Here, the method can be characterized in that, after measuring the drive current, the low potential is supplied to the one of the first common wiring and the second common wiring and the high potential is supplied to the other in a switching manner, and the drive current flowing in the drive TFT is measured. Moreover, if the method is characterized in that the switching of the potentials of the first common wiring and second common wiring is alternate switching performed for each pixel inspection, the method is preferable in that it is made possible to inspect pixel circuits continuously. Furthermore, if the method is characterized in that the switching of the potentials of these first common wiring and second common wiring is switching after a measurement of a drive current for a drive TFT of an even-numbered pixel or an odd-numbered pixel, the method is excellent in that a switching operation of the potentials can be simplified.

The present invention further relates to a method for manufacturing an active matrix OLED (organic light emitting diode) panel. Specifically, the method for manufacturing an active matrix OLED panel, to which the present invention is applied, comprises: an array step of creating an active matrix having a TFT array including a drive TFT for driving the OLED, in which common wiring to be implemented therein is separated into first common wiring and second common wiring, and the first common wiring and the second common wiring are connected alternately with each other for each horizontal line or each vertical column; an inspection step of inspecting a function of the created active matrix panel; and a cell step of implementing the OLED for an active matrix panel determined to be acceptable in the inspection step. The method is characterized in that, in the inspection step, video data is programmed in a state where a high potential is supplied to either one of the first common wiring and the second common wiring in the active matrix panel created in the array step and a low potential is supplied to the other, and the inspection is performed by observing a current flowing in the drive TFT on the first common wiring or the second common wiring. Here, the method can be characterized in that, in this array step, an active matrix having a TFT array in which either one of the first common wiring and the second common wiring is connected to the drive TFT directly or through another circuit and the other is connected to a pixel electrode through a connection switch is created.

According to the present invention, in the display panel having the drive TFT, the characteristic inspection of the drive TFT can be performed simply.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

Embodiments of the present invention will be described below in detail with reference to the accompanying drawings.

Embodiment 1

Figure 1:
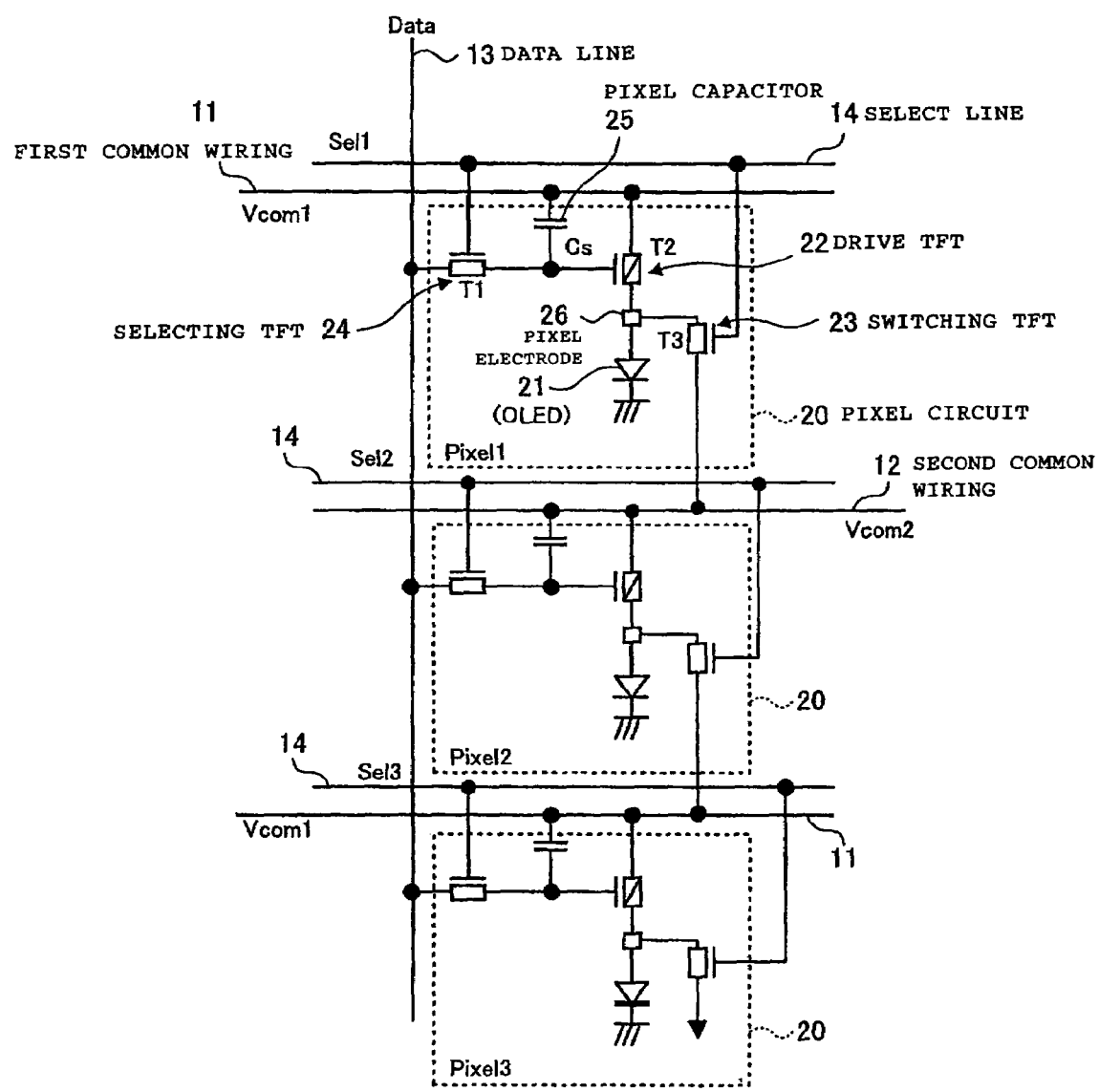
FIG. 1 is a diagram showing a basic circuit configuration of an AMOLED to which this embodiment is applied.
Figure 23:
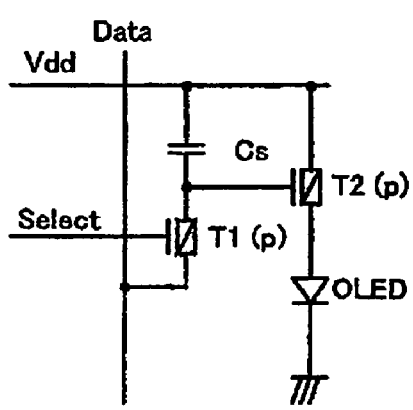
FIGS. 23(a) to 23(d) are diagrams showing examples of a variety of pixel circuits for OLEDs.
Figure 23:
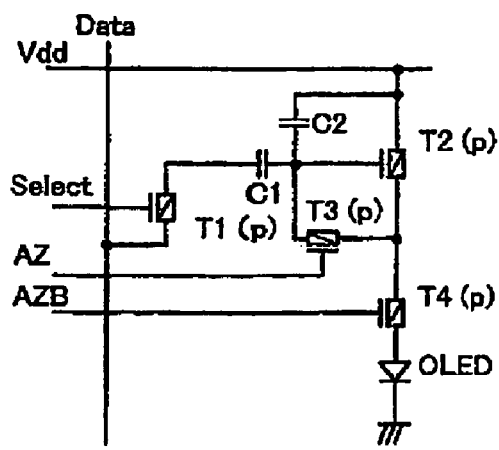
Figure 23:
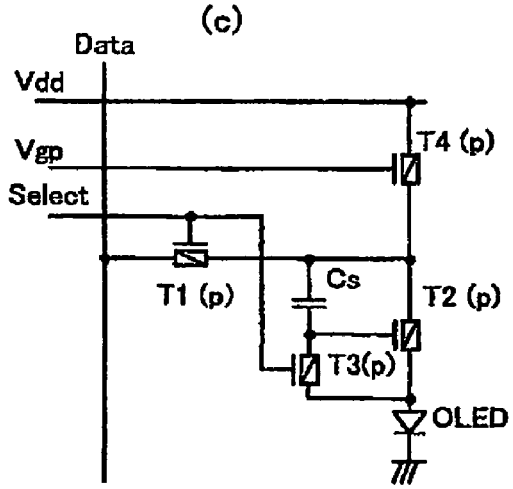
Figure 23:
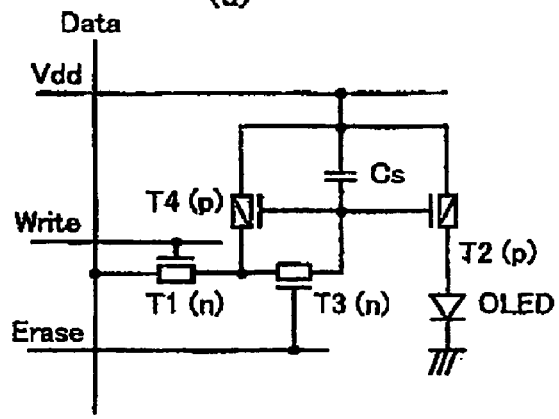

FIG. 1 is a diagram showing a basic circuit configuration of an AMOLED to which this embodiment is applied. In the basic circuit shown in FIG. 1, this embodiment is applied to the circuit by Brody, which is shown in FIG. 23(a). This basic circuit includes pixel circuits 20 provided for each pixel, first common wiring (Vcom1) 11 and second common wiring (Vcom2) 12 as two lines of common wiring connected to a power source Vdd, a data line (Data) 13 to which video data is applied, and select lines (Sel) 14 to which select pulses for selecting lines are sequentially applied.

Each pixel circuit 20 includes an OLED (organic light emitting diode) 21, which is an EL device as a light-emitting device, a drive TFT (T2) 22 for driving the OLED 21, and a switching TFT (T3) 23, which is a connection switch for giving a current path to the drive TFT 22 in a state where only a TFT array is provided (the OLED 21 is not implemented). Moreover, the pixel circuit 20 includes a selecting TFT (T1) 24 to be controlled by the select line (Sel) 14, a pixel capacitor (Cs) 25, and a pixel electrode 26. The selecting TFT 24 performs programming for the pixel capacitor 25 from the data line 13 by control of the select line 14.

It is an object of this embodiment to provide a pixel circuit configuration and a panel configuration, which can easily measure an Id-Vgs characteristic and characteristic parameters such as Vth and β of the drive TFT 22. For example, in the pixel circuit 20 of a pixel 1 (Pixel1) shown in the uppermost stage of FIG. 1, a current path from the first common wiring (Vcom1) 11 to the second common wiring (Vcom2) 12 is realized by the switching TFT 23. As described above, this embodiment has features in that the common wiring is separated into two lines of the first common wiring (Vcom1) 11 and the second common wiring (Vcom2) 12, which are then arranged in a comb shape, and that the inspecting current path is given to the drive TFT 22 by adding the switching TFT 23 to the pixel electrode 20.

Figure 2:
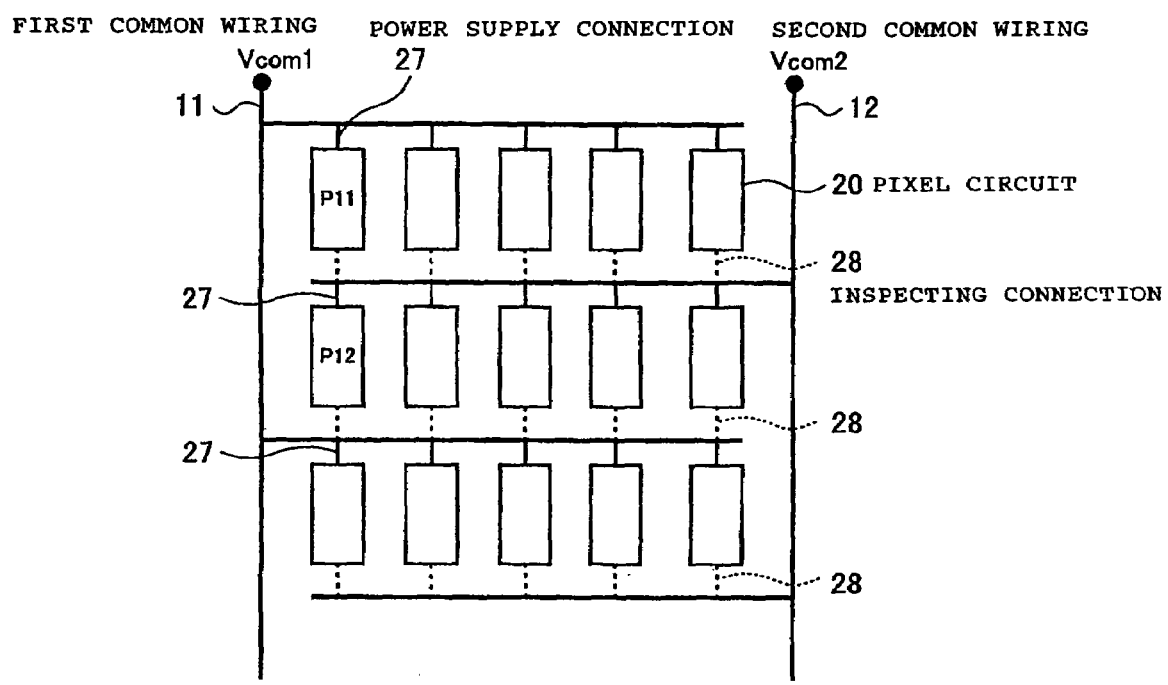
FIG. 2 is a diagram showing a basic configuration of common wiring.

FIG. 2 is a diagram showing a basic configuration of the common wiring. As mentioned above, the common wiring for the supply of the power source is separated into the two lines, which are the first common wiring (Vcom1) 11 and the second common wiring (Vcom2) 12. The first common wiring and the second common wiring are connected alternately with each other for each of the pixel circuits 20. Each pixel circuit 20 is connected to the first common wiring (Vcom1) 11 and the second common wiring (Vcom2) 12 through a power supply connection 27 and an inspecting connection 28. At the time of a normal operation performing image display, the same power source or ground (GND) is connected to the first common wiring (Vcom1) 11 and the second common wiring (Vcom2) 12. At the time of an inspection, different potentials are supplied to the first common wiring (Vcom1) 11 and the second common wiring (Vcom2) 12. In the case of inspecting, for example, a pixel circuit P11 shown in FIG. 2 among the pixel circuits 20, the power source is supplied to the first common wiring (Vcom1) 11, and the GND is supplied to the second common wiring (Vcom2) 12. Meanwhile, in the case of inspecting a pixel circuit P12 shown in FIG. 2, the GND is supplied to the first common wiring (Vcom1) 11, and the power source is supplied to the second common wiring (Vcom2) 12. Note that, while wiring ends of the first common wiring (Vcom1) 11 and second common wiring (Vcom2) 12 are open in FIG. 2, it is also possible to interconnect the wiring ends.

Next, an operation of the basic circuit shown in FIG. 1 will be described.

Figure 3:
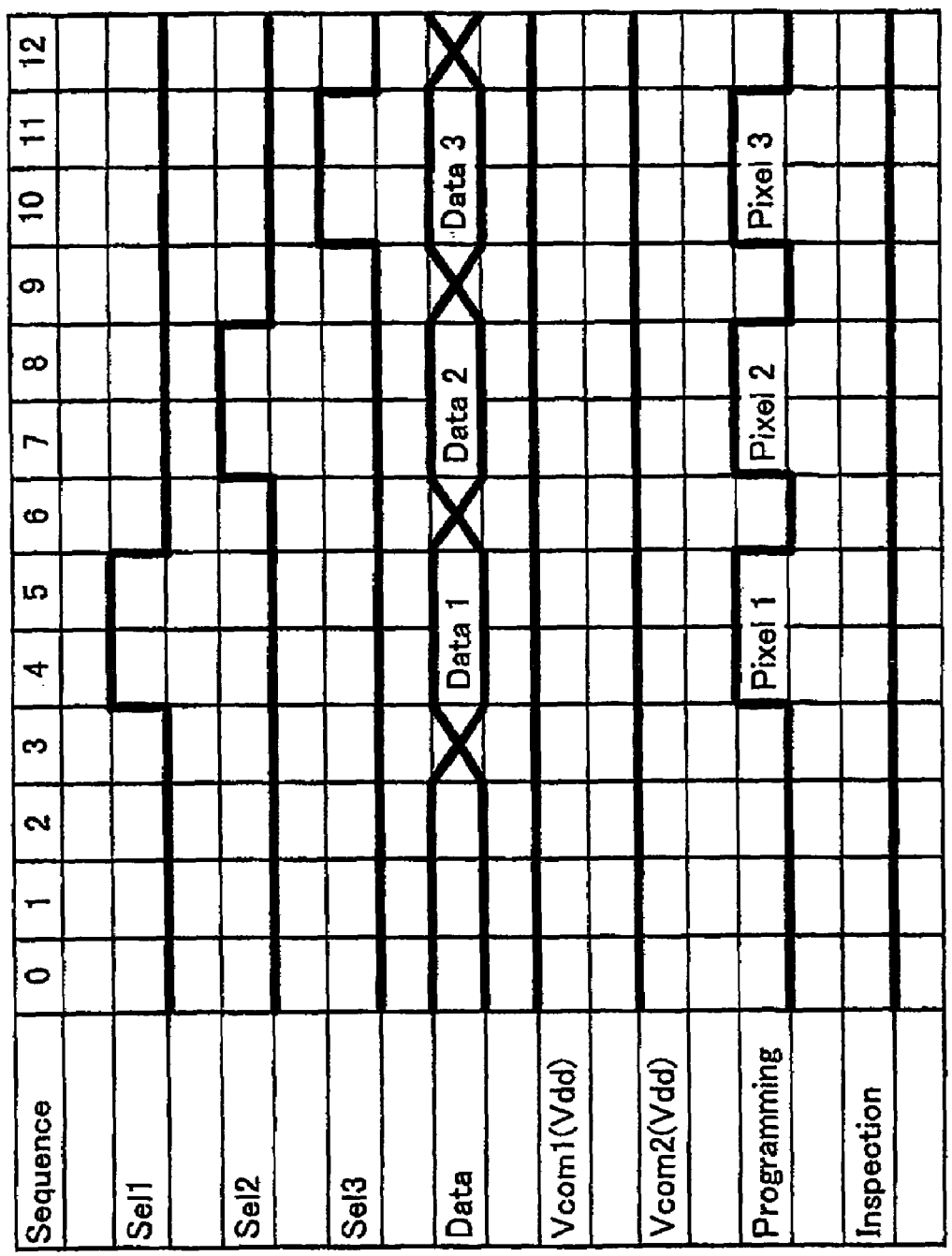
FIG. 3 is a chart showing drive waveforms at the time of a normal display operation in the basic circuit shown in FIG. 1.

FIG. 3 is a chart showing drive waveforms at the time of the normal display operation in the basic circuit shown in FIG. 1. The first common wiring (Vcom1) 11 and the second common wiring (Vcom2) 12 are connected to the power source Vdd of, for example, 10V. To the select lines 14 (Sel1 to Sel3 in FIG. 3), the select pulses for selecting the lines are sequentially applied. By applying video data to the data lines (Data) 13 in synchronization with these select pulses, the display operations (programming) can be executed sequentially for the pixel 1, the pixel 2 and the pixel 3.

Figure 4:
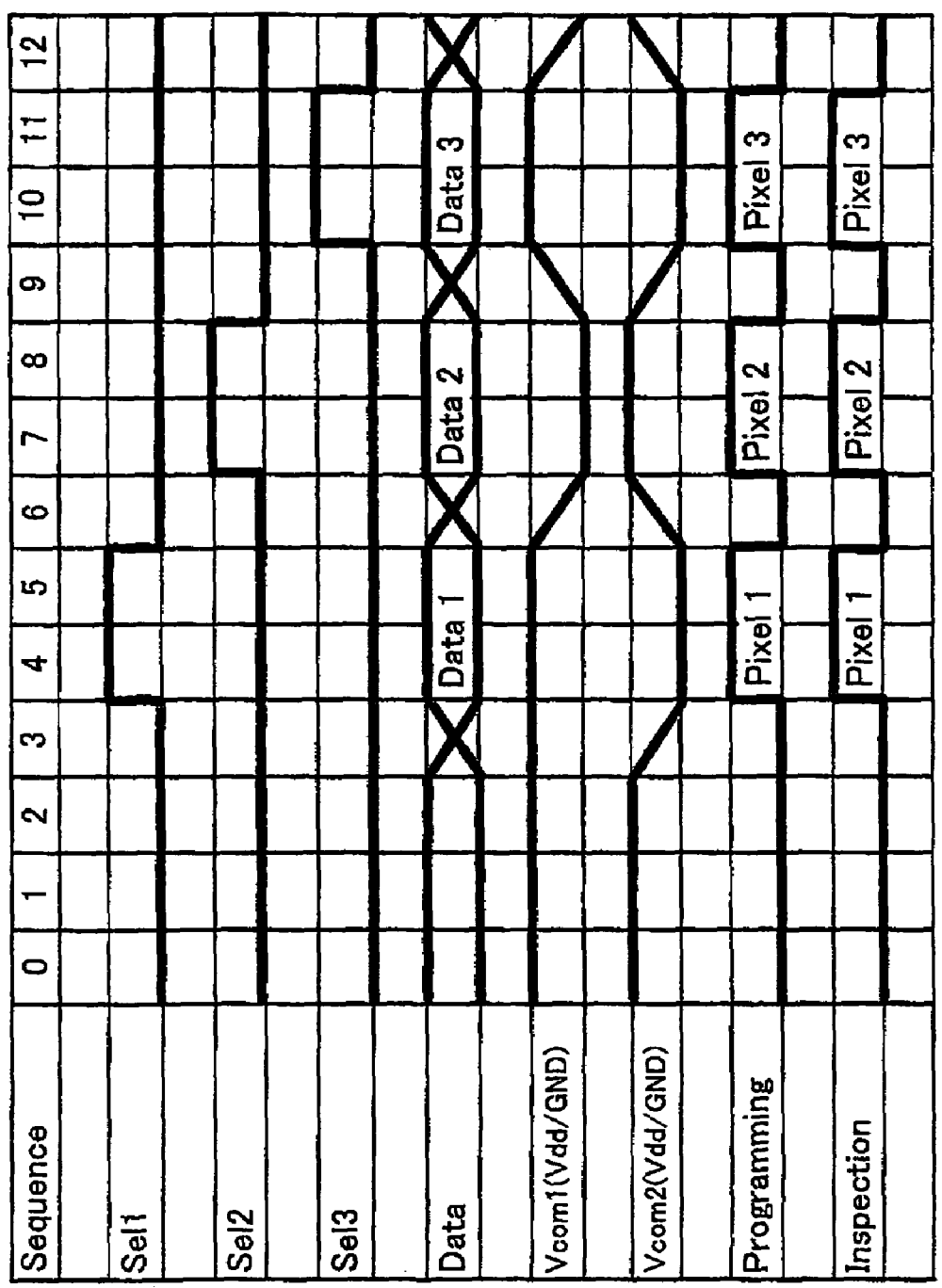
FIG. 4 is a chart showing drive waveforms in the case of sequentially inspecting drive TFTs in respective pixel circuits in the basic circuit shown in FIG. 1.

FIG. 4 is a chart showing drive waveforms in the case of sequentially inspecting the drive TFTs 22 in the respective pixel circuits 20 in the basic circuit shown in FIG. 1. A difference between the operation at the time of this inspection and at the time of the normal operation is that potentials of the first common wiring (Vcom1) 11 and the second common wiring (Vcom2) 12 are changed in synchronization with the select pulses. In sequences 4 and 5 shown in FIG. 4, the pixel 1 (Pixel1) is selected, and data 1 (Data1) from the data line (Data) 13 is programmed in the pixel capacitor (Cs) 25 of the pixel 1. In this case, the switching TFT 23 is in an ON state, and the second common wiring (Vcom2) 12 is at a GND level. Accordingly, a drive current corresponding to a programming voltage flows from the first common wiring (Vcom1) 11 through the drive TFT 22 and the switching TFT 23 to the second common wiring (Vcom2) 12. In this case, the drive current can be observed by connecting a current measurement circuit or charge integration circuit to be described later to the first common wiring (Vcom1) 11 or the second common wiring (Vcom2). In sequences 7 and 8, the pixel 2 (pixel2) is selected, and data 2 (Data2) is programmed in the pixel capacitor (Cs) 25 of the pixel 2. In this case, the switching TFT 23 is in the ON state, and the first common voltage is at the GND level. Accordingly, a drive current corresponding to a programming voltage flows from the second common wiring (Vcom2) 12 through the drive TFT 22 and the switching TFT 23 to the first common wiring (Vcom1) 11. In this case, the drive current can be observed by connecting the current measurement circuit or the charge integration circuit to the first common wiring (Vcom1) 11 or the second common wiring (Vcom2). As described above, according to this embodiment, it is made possible to inspect the pixel circuits continuously.

Next, the case of performing inspections individually for odd-numbered lines and even-numbered lines will be described.

Figure 5:
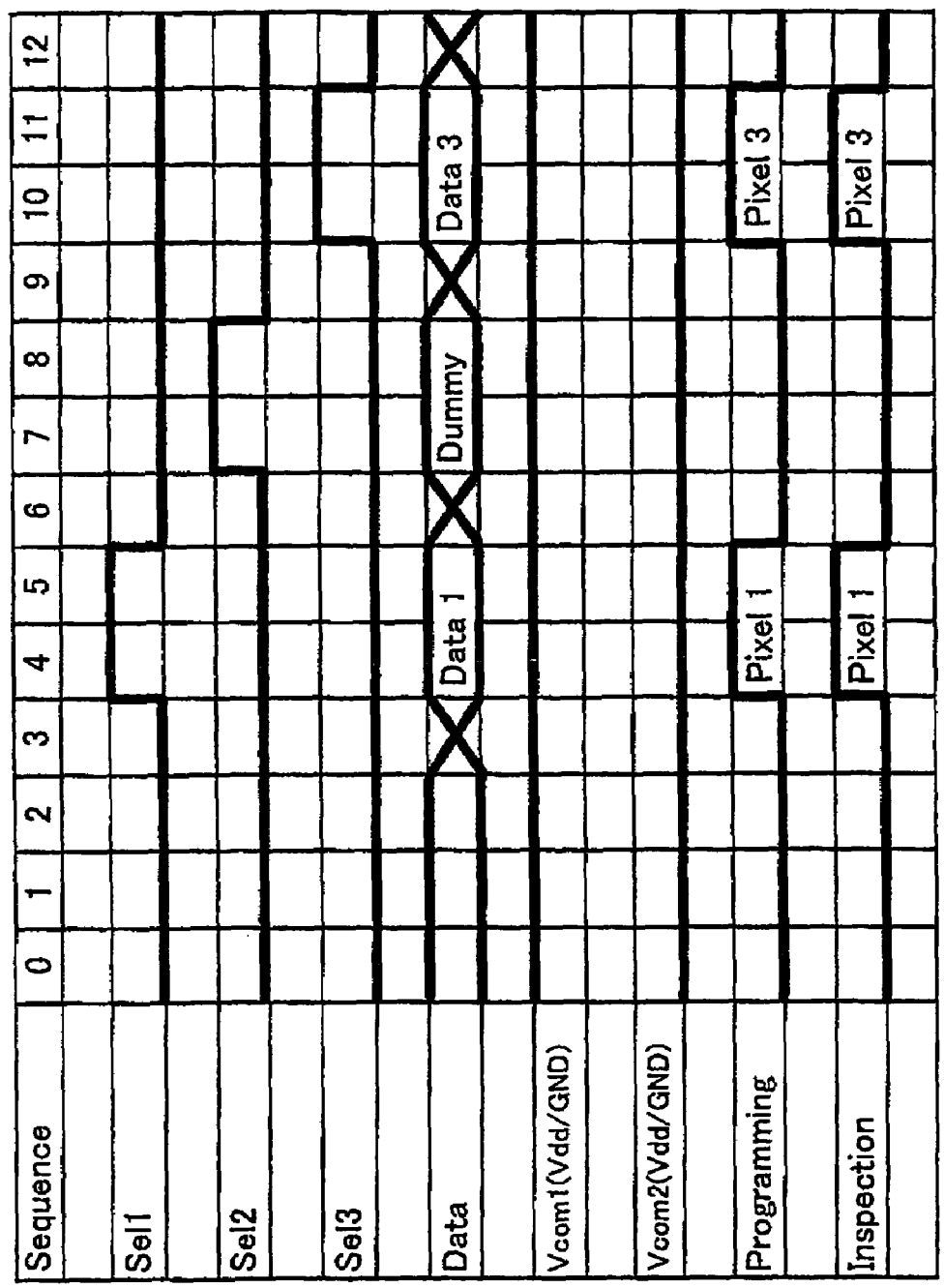
FIG. 5 is a chart showing waveforms in the case of sequentially inspecting drive TFTs of odd-numbered pixels.

FIG. 5 is a chart showing waveforms in the case of sequentially inspecting drive TFTs 22 of odd-numbered pixels. A difference between FIG. 5 and FIG. 4 is that the potentials of the first common wiring (Vcom1) and second common wiring (Vcom2) 12 are not changed in synchronization with the select pulses. In the example shown in FIG. 5, the first common wiring (Vcom1) 11 is connected to the Vdd, and the second common wiring (Vcom2) 12 is connected to the GND. In sequences 4 and 5, the pixel 1 (Pixel1) is selected, and the data 1 (Data1) is programmed in the pixel capacitor (Cs) 25 of the pixel 1. In this case, the switching TFT 23 is in the ON state, and the second common wiring (Vcom2) 12 is set at the GND level. Accordingly, the drive current corresponding to the programming voltage flows from the first common wiring (Vcom1) 11 through the drive TFT 22 and the switching TFT 23 to the second common wiring (Vcom2) 12. In this case, the drive current can be observed by connecting the current measurement circuit or the charge integration circuit to the first common wiring (Vcom1) 11 or the second common wiring (Vcom2) 12.

In sequences 7 and 8 shown in FIG. 5, the pixel 2 (Pixel2) is selected, and dummy data (Dummy) is programmed in the pixel capacitor (Cs) 25 of the pixel 2. However, normal programming cannot be performed because the second common wiring (Vcom2) 12 is set at the GND level. However, this does not affect the inspection. In sequences 10 and 11, the pixel 3 (Pixel3) is selected, and data 3 (Data3) is programmed in the pixel capacitor (Cs) 25 of the pixel 3. In this case, the switching TFT 23 is in the ON state, and the second common wiring (Vcom2) 12 is set at the GND level. Accordingly, a drive current corresponding to the programming voltage flows from the first common wiring (Vcom1) 11 through the drive TFT 22 and the switching TFT 23 to the second common wiring (Vcom2) 12. In this case, the drive current can be observed by connecting the current measurement circuit or the charge integration circuit to the first common wiring (Vcom1) 11 or the second common wiring (Vcom2) 12. As described above, according to the inspection method shown in FIG. 5, it is made possible to inspect the odd-numbered pixel circuits 20 continuously. After the end of the inspection of the odd-numbered pixels, the first common wiring (Vcom1) 11 is set at the GND level, the second common wiring (Vcom2) 12 is set at a power source level (Vdd), and similar operations are performed, thus making it possible to inspect the even-numbered pixel circuits 20. Specifically, by performing the sequences as shown in FIG. 5, it becomes unnecessary to change the potentials of the first common wiring (Vcom) 11 and second common wiring (Vcom2) 12 during the inspection, and the control operation for the potentials can be simplified.

Next, an inspection (measurement) circuit will be described.

Figure 6:
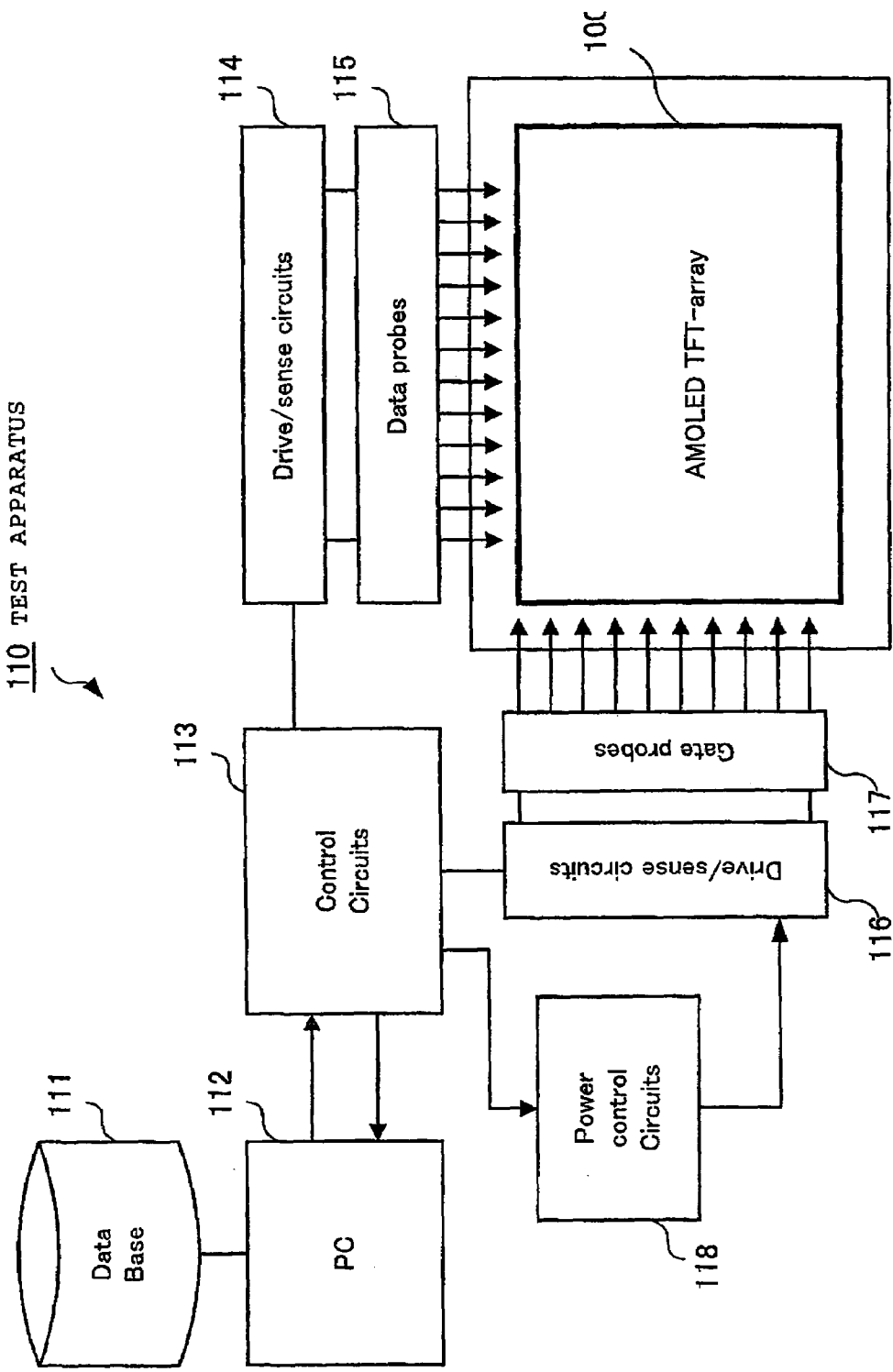
FIG. 6 is a diagram showing a configuration of a test apparatus for use in an inspection step.

FIG. 6 is a diagram showing a configuration of a test apparatus 110 for use in the inspection step. Here, a TFT array 100 having, for example, such a basic circuit configuration as shown in FIG. 1 is inspected. The test apparatus 110 includes a data base 111, a computer (PC) 112, control circuits 113, drive/sense circuits 114, data probes 115, drive/sense circuits 116, gate probes 117, and power control circuits 118.

In the storage device 111 of the test apparatus 110, information necessary to determine quality of the TFT array 100 to be inspected and information necessary to perform measurements therefor are stored. Based on inputted data, the computer (PC) 112 executes determination processing based on the information stored in the storage device 111. The measurement control circuits 113 manage the measurement sequences of the inspection method. Moreover, the drive/sense circuits 114 and 116 are analog circuits generating drive signals of the AMOLED and acquiring measured waveforms of the TFT array 100. Integration circuits to be described later are implemented in these drive/sense circuits 114 and 116. The data and gate probes 115 and 117 supply the AMOLED drive signal generated in the drive/sense circuits 114 and 116 to the TFT array 100 to be measured, and acquire the measured waveforms from the TFT array 100. The voltage control circuits 118 control the power source voltage supplied to the TFT array 100 through the drive/sense circuits 116 and the gate probes 117.

In the test apparatus 110, the measurement sequences for the inspection are managed in the measurement control circuits 113. The power supply voltage and GND voltage supplied from the first common wiring (Vcom1) 11 and the second common wiring (Vcom2) 12 are controlled by the voltage control circuits 118 under the control of the measurement control circuits 113, and are supplied to the TFT array 100 through the drive/sense circuits 116 and the gate probes 117. Moreover, measured values of the TFT array 100 are inputted to the drive/sense circuits 116 through the gate probes 117 and are observed. The observed value is converted into digital data by the measurement control circuits 113 and is inputted to the computer (PC) 112. In the computer (PC) 112, the measurement data is processed, the quality determination is performed, and so on while referring to the information stored in the storage device 111.

Figure 7:
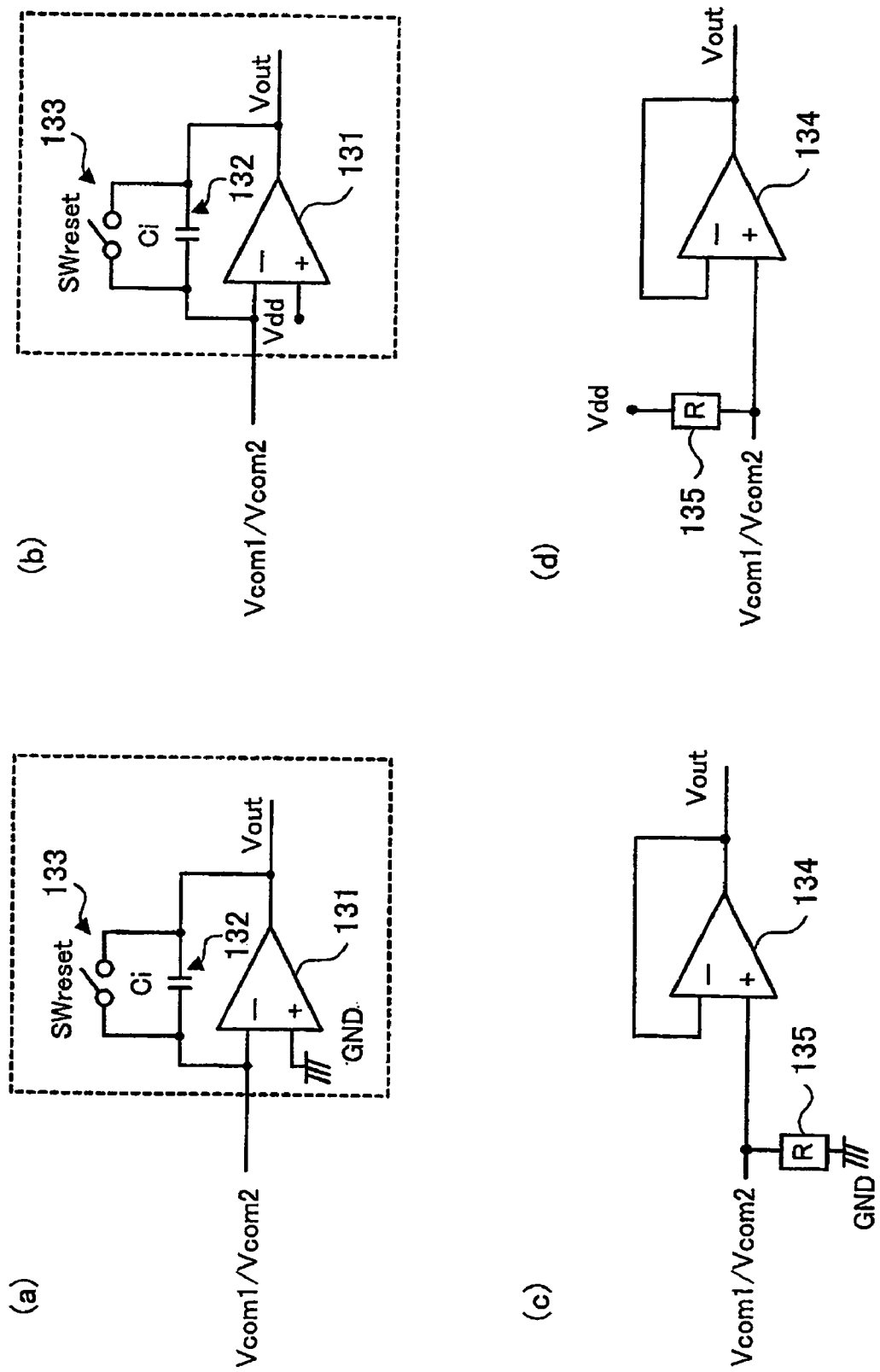
FIGS. 7(a) to 7(d) are diagrams showing examples of measurement circuits for use in signal generation/signal measurement circuits of FIG. 6.

FIGS. 7(a) to 7(d) are diagrams showing examples of measurement circuits for use in the drive/sense circuits 116 of FIG. 6. FIGS. 7(a) and 7(b) show examples of the integration circuits, and FIGS. 7(c) and 7(d) show examples of the current measurement circuit. The integration circuits or the current measurement circuits using low resistance R, which are as shown in FIGS. 7(a) to 7(d), are connected to the first common wiring (Vcom1) 11 or the second common wiring (Vcom2) 12, and the measurements are performed, thus making it possible to simply measure the drive current flowing through the switching TFT 23. FIG. 7 (a) shows a charge integration circuit for performing the measurements in a state where the first common wiring (Vcom1) 11 or the second common wiring (Vcom2) 12 is set at the GND level. Moreover, FIG. 7(b) shows a charge integration circuit for performing the measurements in a state where the first common wiring (Vcom1) 11 or the second common wiring (Vcom2) 12 is set at the Vdd level. Each of the charge integration circuits shown in FIGS. 7(a) and 7(b) includes an operational amplifier 131, a capacitor (C1) 132, and a reset switch (SWreset) 133. Meanwhile, FIG. 7(c) shows a current measurement circuit for performing the measurements in a state where the first common wiring (Vcom1) 11 or the second common wiring (Vcom2) 12 is set at the GND level. Moreover, FIG. 7(d) shows a current measurement circuit for performing the measurements in a state where the first common wiring (Vcom1) 11 or the second common wiring (Vcom2) 12 is set at the Vdd level. In each of the current measurement circuits shown in FIGS. 7(c) and 7(d), an operational amplifier 134 and a low resistance (R) 135 for monitoring the current are provided.

By measuring the drive currents by using the circuits as shown in FIGS. 7(a) to 7(d), inspections as below will be made possible.

First, it is made possible to evaluate current characteristics of the drive TFT 22 by means of one-point measurement. Here, the currents are measured while programming the same video data (voltage) in the respective pixels as shown in FIG. 4. The currents are measured for all of the pixels with respect to a predetermined Vgs (a voltage between a gate and source of the drive TFT 22), thus making it possible to inspect variations of the currents for the drive TFTs 22 in the panel (TFT array 100). Pixels in which the measured current values are within a preset criteria range are regarded as normal, and pixels out of the criteria range are regarded as defective. In such a way, the quality of the panel can be determined at high speed.

Second, it is made possible to measure the Vth and β of the drive TFT 22 by means of multi-point measurement. Here, for one pixel, the drive current is measured while changing the programming voltage (Vgs of the drive TFT 22). The obtained measurement data indicates Id-Vgs characteristics. By analyzing this data, effective parameters for the characteristic evaluation of the TFT, such as the Vth and β of the drive TFT 22, can be extracted.

Because the drive TFT 22 is operated in a saturation region, a drain current Id can be approximated by the following equation:

$$Id = 0.5\beta(Vgs - Vth)^2$$

Here, β is established as: $\beta = \mu \cdot Cox \cdot W/L$, which is a value determined by mobility μ of the TFT, gate capacity Cox per area, and a ratio of channel width W and channel length L of the TFT.

Figure 8:
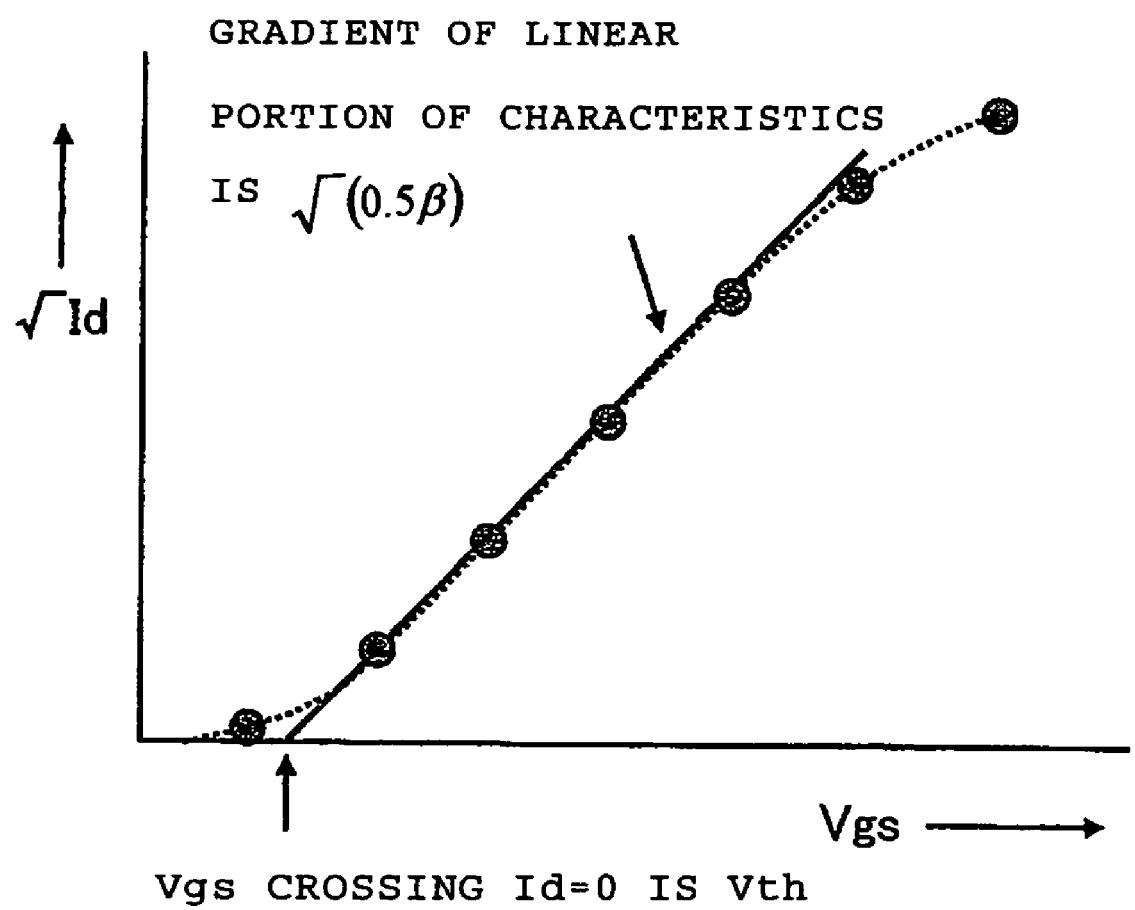
FIG. 8 is a graph for explaining a method of estimating Vth and β from the Id-Vgs characteristics measured by the circuits shown in FIG. 7.

FIG. 8 is a graph for explaining a method of estimating the Vth and the μ based on the Id-Vgs characteristics measured by the circuits shown in FIG. 7. In FIG. 8, an abscissa axis represents Vgs, and an ordinate axis represents $(id)^{1/2}$. As shown in FIG. 8, when the drain current Id is measured while changing the Vgs of the drive TFT 22, and the obtained values are plotted, a gradient of the graph becomes $(0.5\beta)^{1/2}$ based on the above-described equation. Moreover, Vgs crossing Id=0 becomes Vth. In such a way, the Vth and the β can be estimated. Note that it is also possible to obtain the Vth and the β for all of the pixels and to perform evaluation for the variations thereof.

As described above, in this embodiment, the wiring (usually, referred to as the common wiring) for connecting the power source Vdd or the GND to the pixel circuit 20 is separated into the two lines, and the configuration in which the lines are alternately connected for each horizontal line or vertical column of the pixels is realized. Moreover, in each of the pixel circuits 20, the switching TFT 23 playing a role of the connection switch between the pixel electrode 26 and the common wiring is added, thus making it possible to secure the current path from the common wiring (for example, the first common wiring (Vcom) 11) for supplying the power source to the other common wiring (for example, the second common wiring (Vcom2) 12). In the inspection step, the video data is programmed in a state where the high potential is supplied to one of the common wiring and the low potential is supplied to the other, and the current flowing in the drive TFT 22 is observed by the common wiring, thus making it possible to inspect the characteristics of the drive TFT 22.

Embodiment 2

In Embodiment 2, with regard to retention characteristics of the pixel capacitor 25 after the elapse of a predetermined time since the programming, a circuit capable of inspecting the retention characteristics and an inspection method thereof will be described. Note that the same reference numerals will be used for the same functions as those in Embodiment 1, and detailed description thereof will be omitted here. The same can be said for embodiments to be described below in this specification.

Figure 9:
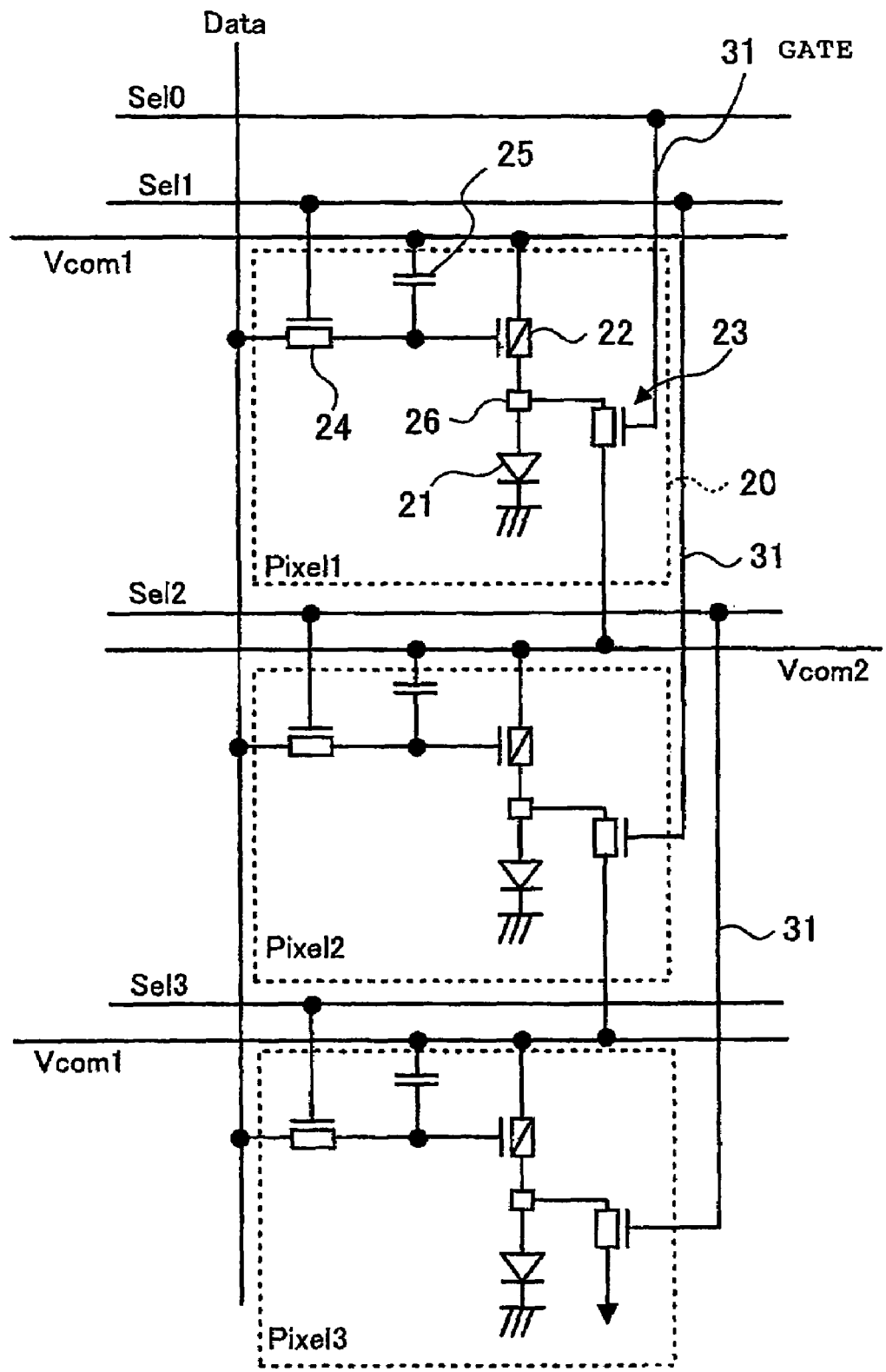
FIG. 9 is a diagram showing an example in which the present invention is applied to pixel circuits of a voltage programming system composed of two TFTs.

FIG. 9 is a diagram showing an example in which the present invention is applied to pixel circuits of a voltage programming system composed of two TFTs, which is an application example to the Brody's circuit shown in FIG. 23(a). This example is different from the example shown in FIG. 1 in that a gate 31 of the TFT 23, which is a connection switch, is connected to the select line 14 for the pixel on the line immediately therebefore. Sel0 shown in FIG. 9 is a dummy select line 14, to which the gate 31 of the pixel 1 (Pixel1) is connected. The gate 31 of the pixel 2 (Pixel2) is connected to Sel1 that is a line immediately therebefore. The gate 31 of the pixel 3 (Pixel3) is connected to Sel2 that is a line immediately therebefore. A normal drive performing the display is performed similarly to the one described with reference to FIG. 3. Moreover, the gate 31 of the switching TFT 23 is connected to the select line 14 therebefore, and accordingly, the retention characteristics of the pixel capacitor 25 after the elapse of a predetermined time since the programming can be inspected.

Figure 10:
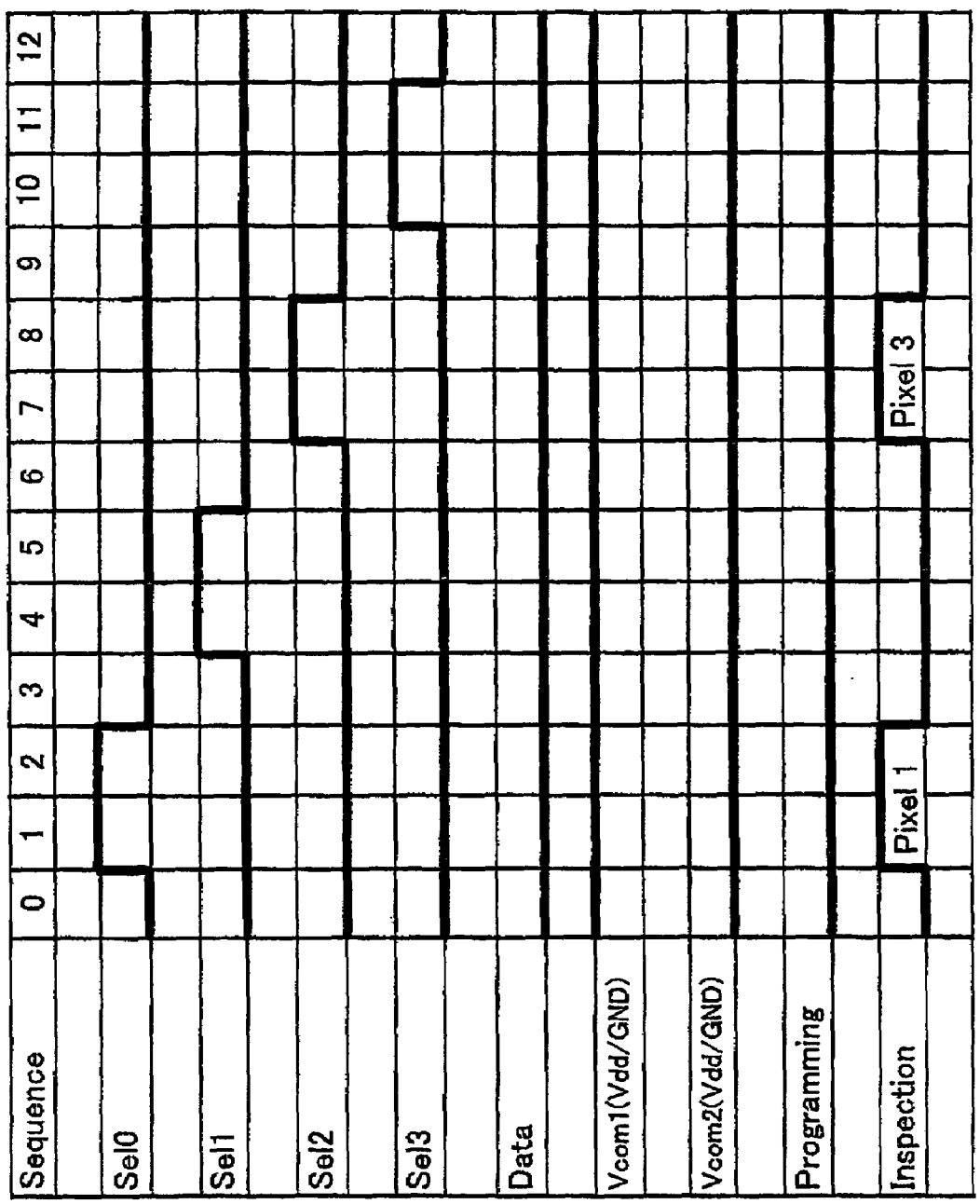
FIG. 10 is a chart showing an example of drive waveforms for inspecting retention characteristics by a circuit of FIG. 9.

FIG. 10 is a chart showing an example of drive waveforms for inspecting the retention characteristics by the circuit of FIG. 9. In FIG. 10, first, the first common wiring (Vcom1) 11 is set at the power source potential, the second common wiring (Vcom2) 12 is set at the GND potential, and then the programming is performed in accordance with FIG. 3. Thereafter, the retention characteristics are inspected. Specifically, in FIG. 10, the programming is performed, and the circuits are driven as shown in FIG. 10, thus enabling the inspection of the retention characteristics. In this case, the pixels in the odd-numbered lines, that is, the pixel 1 (Pixel1), the pixel 3 (Pixel3) . . . , are inspected. Thereafter, the first common wiring (Vcom1) 11 is set at the GND potential, and the second common wiring (Vcom2) 12 is set at the power source potential, thus making it possible to inspect the pixels of the even-numbered lines.

Figure 11:
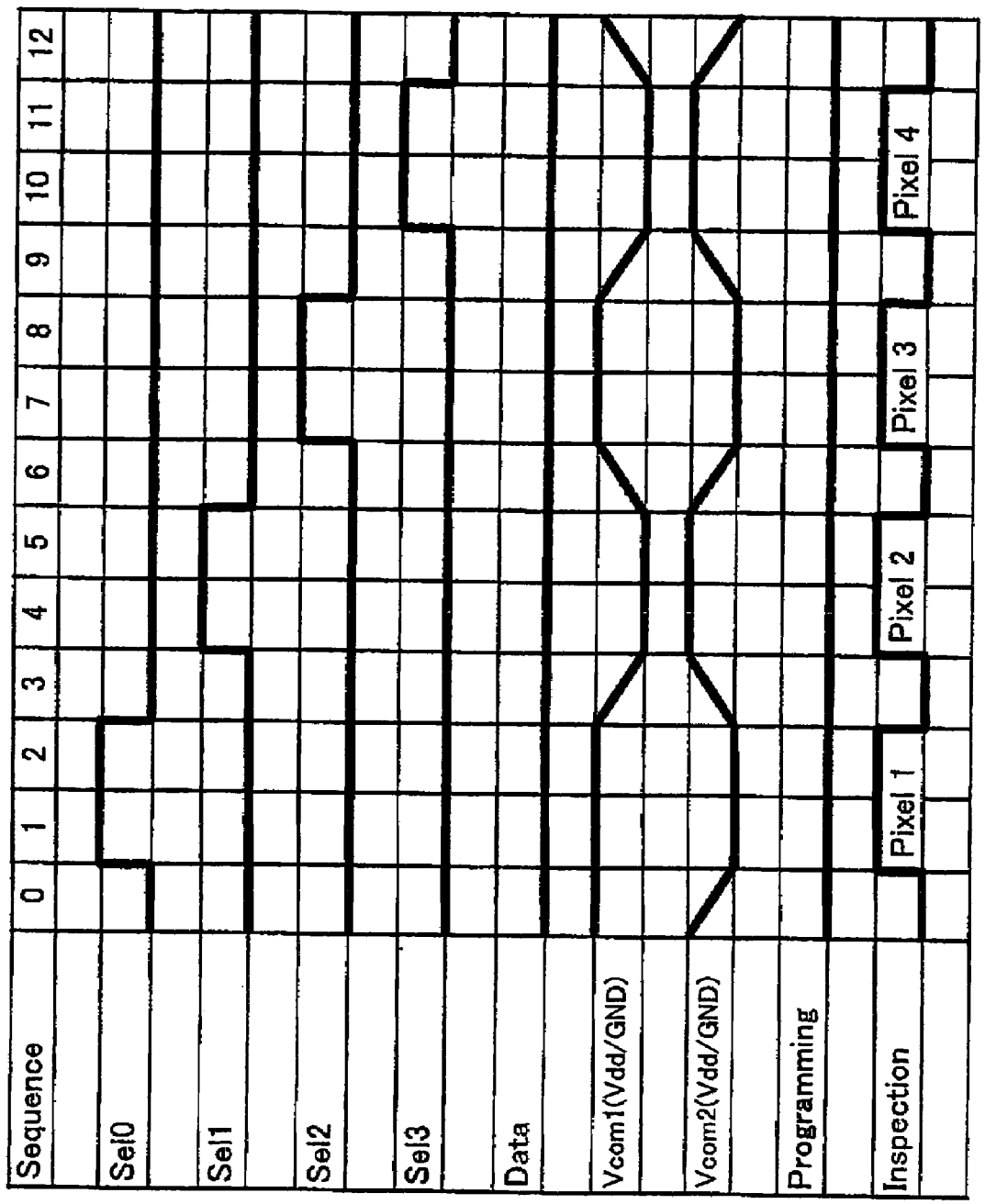
FIG. 11 is a chart showing an example of drive waveforms according to another inspection method for inspecting the retention characteristics by the circuit of FIG. 9.

FIG. 11 is a chart showing an example of drive waveforms according to another inspection method for inspecting the retention characteristics by the circuit of FIG. 9. In FIG. 11, the programming is performed in accordance with FIG. 3, and then the first common wiring (Vcom1) 11 and the second common wiring (Vcom2) 12 are alternately switched, thus making it possible to sequentially inspect the pixels in the vertical direction. Specifically, in the select lines 14, the pixel 1 (Pixel1) can be inspected by a select pulse of Sel0, the pixel 2 (Pixel2) can be inspected by a select pulse of Sel1, the pixel 3 (Pixel3) can be inspected by a select pulse of Sel2, and the pixel 4 (Pixel4) can be inspected by a select pulse of Sel3. In such a way, the pixels can be inspected sequentially in the vertical direction.

Figure 12:
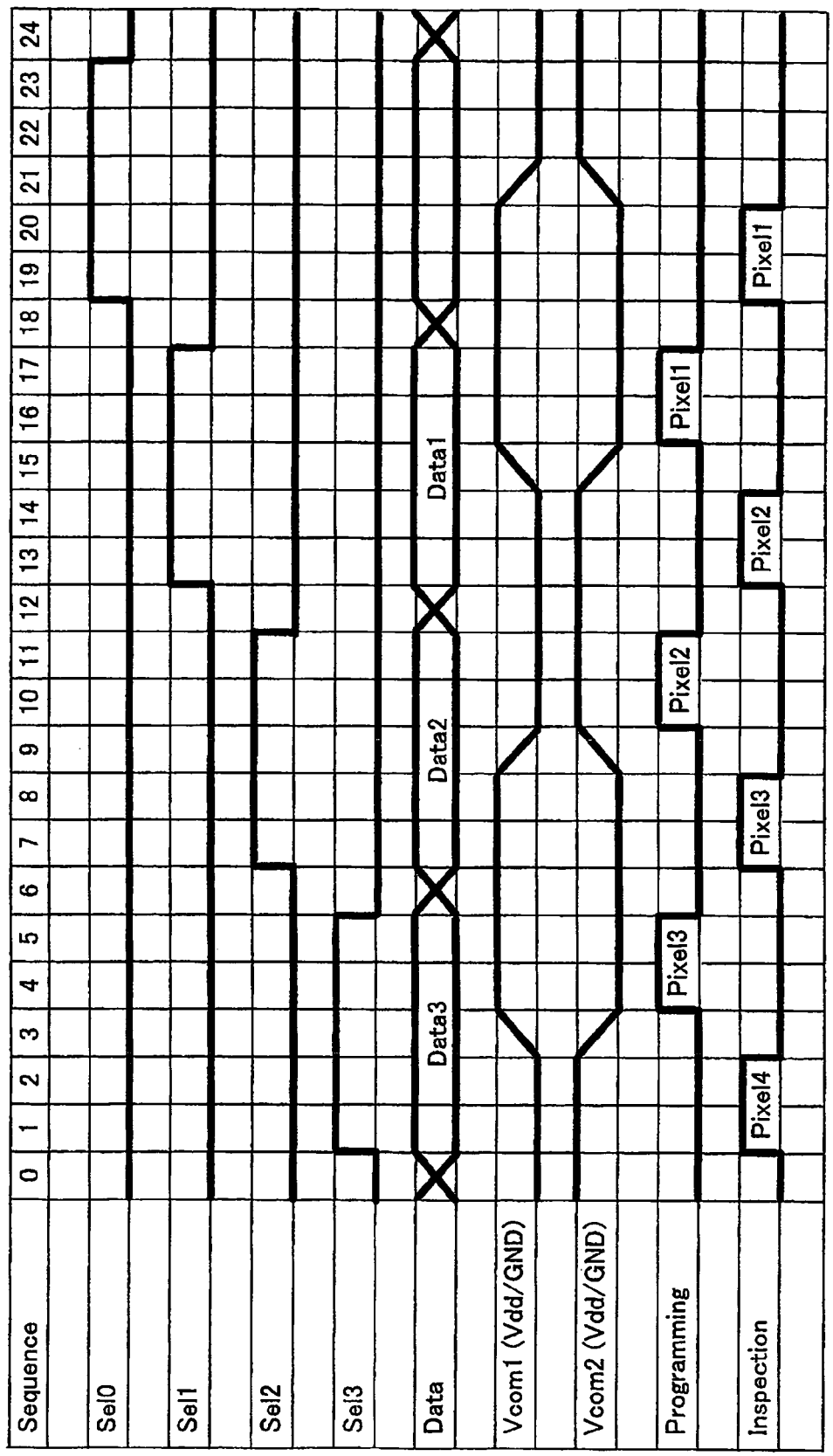
FIG. 12 is a chart showing an example of drive waveforms according to another inspection method using the circuit of FIG. 9.

FIG. 12 is a chart showing an example of drive waveforms according to another inspection method using the circuit of FIG. 9, where the inspection is made possible to perform the inspection sequentially following the programming. The select pulses by the select lines 14 are shifted reverse to the case of FIG. 11. By adjusting the width of the select pulses, the change of the drive currents can be observed from a point of time immediately after the programming. For example, the enlargement of the width of the select pulses enables the inspection of the retention characteristics of the pixel capacitor 25. In such a way, according to the inspection method shown in FIG. 12, it is made possible to inspect the retention characteristics while performing the programming. Note that, in the example shown in FIG. 9, the gate of the switching TFT 23, which is a connection switch, is connected to the select line 14 immediately therebefore. However, the gate may be connected to the select line 14 one more before. Alternatively, a configuration can be made such that the gate is connected to the select line 14 at the next stage.

Embodiment 3

Different from Embodiments 1 and 2, Embodiment 3 has a feature that the gate of the connection switch is connected to the drain (of the pixel electrode 26) and the connection switch functions as a diode.

Figure 13:
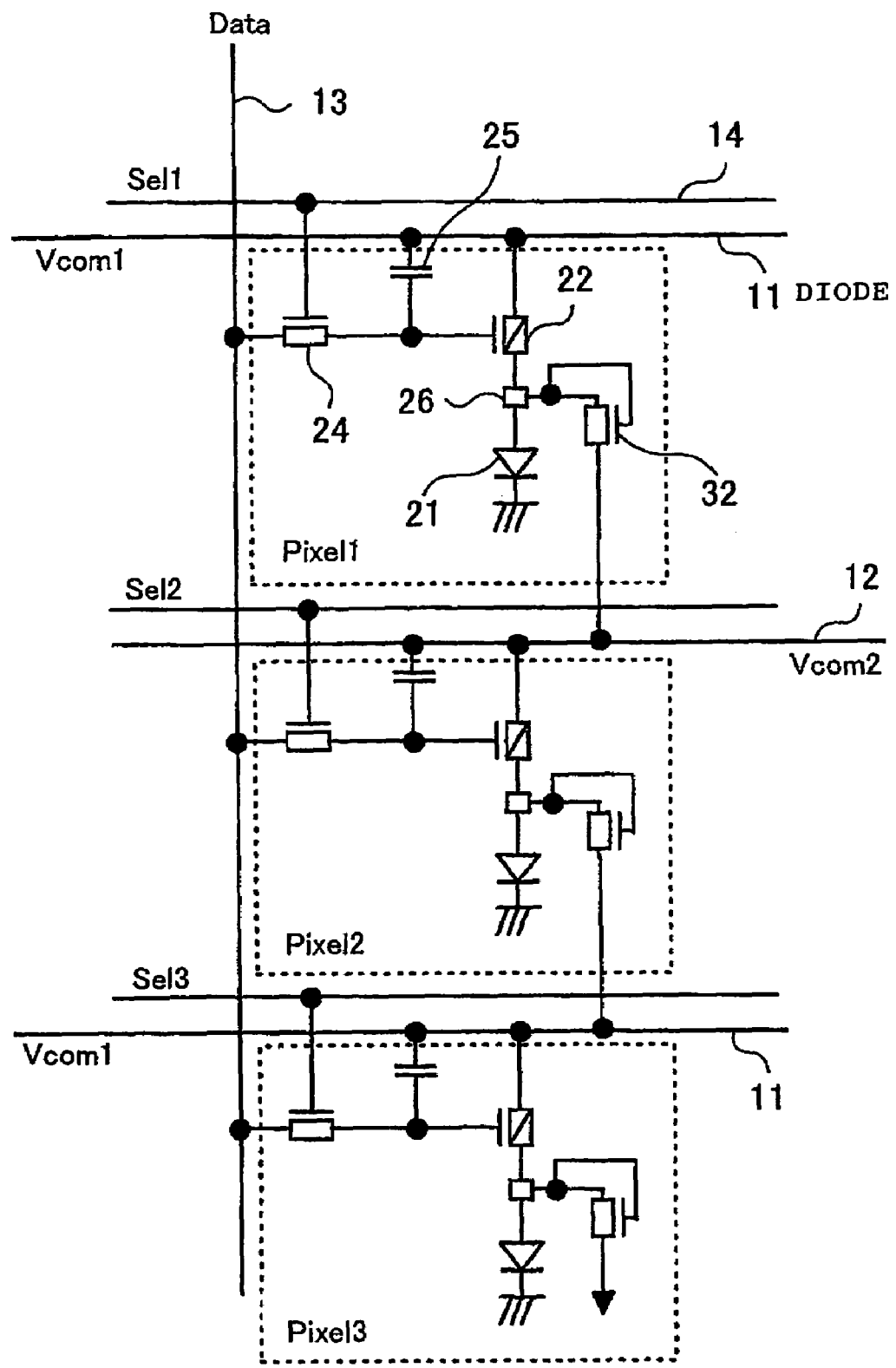
FIG. 13 is a diagram showing another example in which the present invention is applied to the pixel circuits of the voltage programming system composed of two TFTs.

FIG. 13 is a diagram showing another example in which the present invention is applied to the pixel circuits of the voltage programming system composed of two TFTs. Here, a diode 32 is used instead of the switching TFT 23, and the gate of the connection switch (the diode 32) is connected to the drain of the connection switch. In the normal drive performing the display, the first common wiring (Vcom1) 11 and the second common wiring (Vcom2) 12 are set at the power source voltage, which is a higher potential as compared with that of the pixel electrode 26. Accordingly, the diode 32 is subjected to reverse bias and turned to an OFF state. Hence, the normal drive is made possible by the same drive method as in FIG. 3. Meanwhile, at the time of the inspection, the common wiring to which the diode 32 is connected is set at a lower potential as compared with that of the pixel electrode 26. Accordingly, the diode 32 is turned to an ON state, and the current path of the drive TFT 22 is configured.

Figure 14:
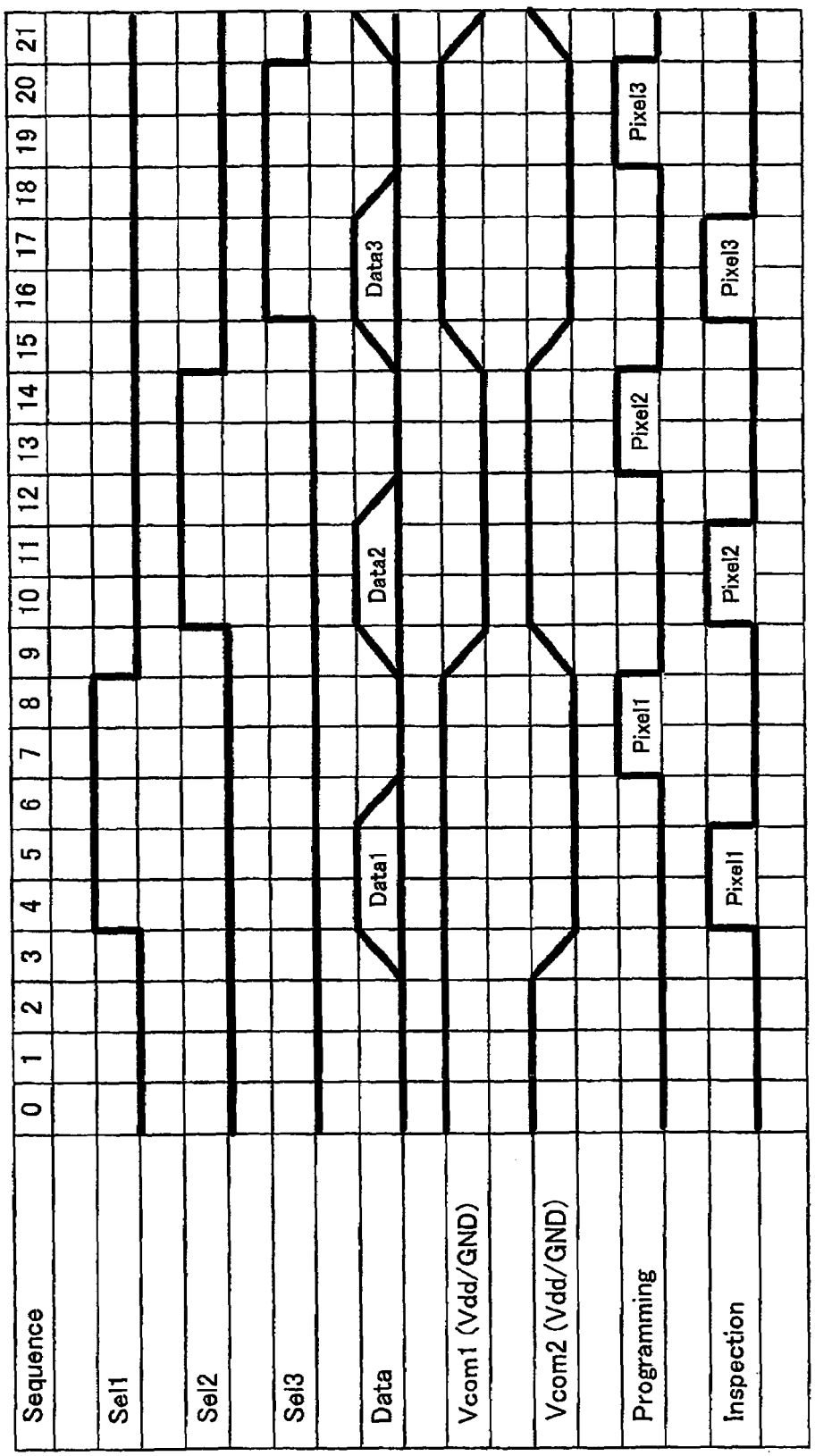
FIG. 14 is a chart showing drive waveforms for inspecting a circuit shown in FIG. 13.

FIG. 14 is a chart showing drive waveforms for inspecting the circuit shown in FIG. 13. Here, all of the pixels are set at a light off state before the inspection in the normal drive shown in FIG. 3. In sequences 4 to 8, the pixel 1 (Pixel1) is selected, and in sequences 4 and 5, the drive current is measured while programming a voltage for the inspection. By changing the programming voltage, the Id-Vgs characteristics of the drive TFT 22 are obtained. After the inspection of the pixel 1 (Pixel1), in sequences 7 and 8, the pixel 1 (Pixel1) is returned to the light off state, and then the inspection of the pixel 2 (Pixel 2) is started. By repeating this operation, it is made possible to inspect all of the pixels.

Figure 15:
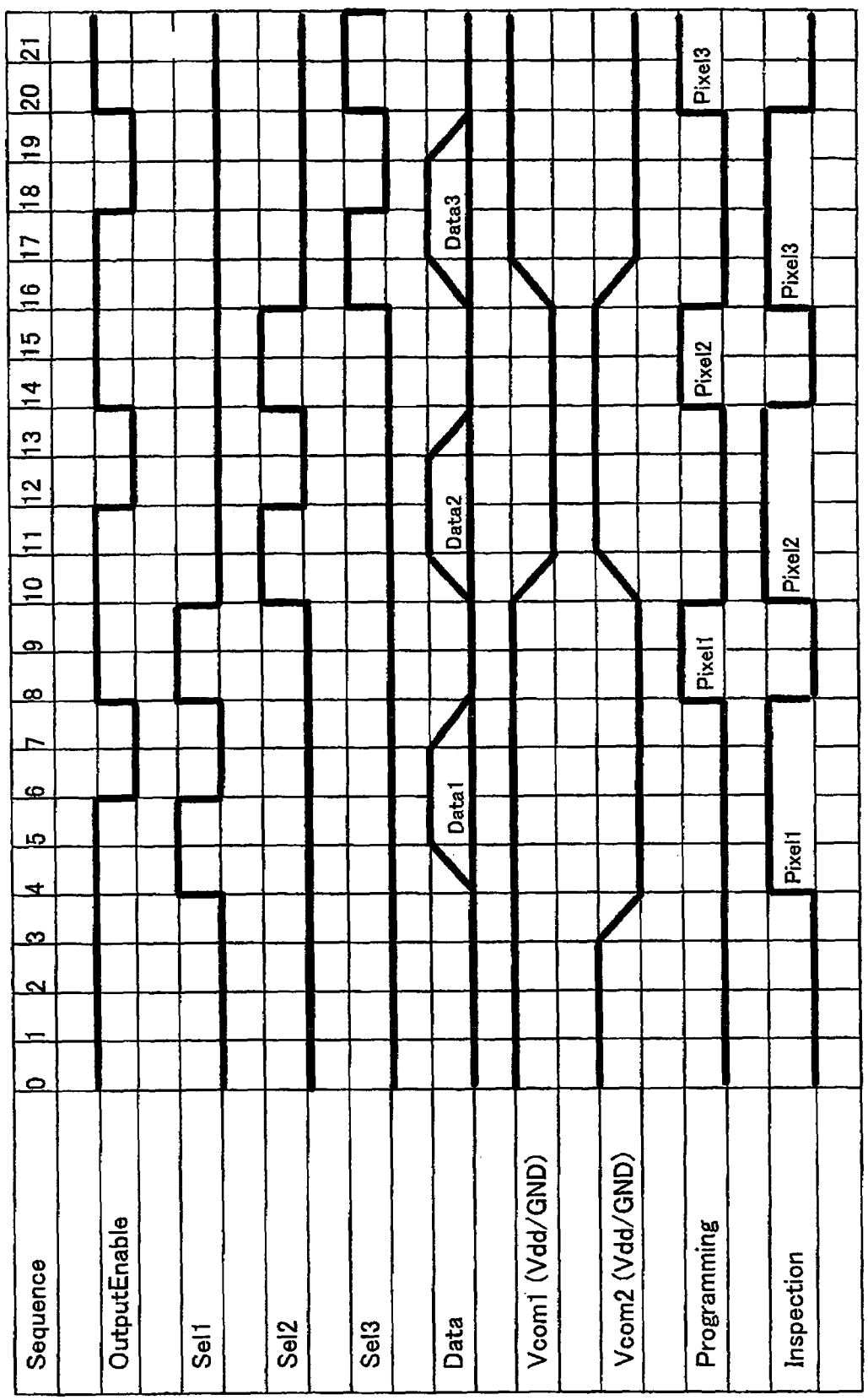
FIG. 15 is a chart showing waveforms for inspecting retention characteristics of the circuit shown in FIG. 13.

FIG. 15 is a chart showing waveforms for inspecting the retention characteristics of the circuit shown in FIG. 13. For example, when panel drive circuits such as the measurement control circuits 113 (driver circuits formed on the panel or external driver circuits) have a waveform adjustment function (usually, referred to as OutputEnable (OE)) of the select pulses as control signals, the waveform of the select pulse can be adjusted such as by cutting a part of the select pulse as shown in sequences 6 and 7 of FIG. 15. In the sequences 6 and 7, the selecting TFT 24 is set at the OFF state after programming the pixel 1 (Pixel1). If the drive current is measured during this period, temporal variations of the drive current can be observed, and it is made possible to inspect (observe) the retention characteristics of the pixel capacitor 25.

Embodiment 4

Embodiment 4 has a feature that Embodiments 1 and 2 are combined and the select lines 14 are selected for every two lines by two connection switches (the switching TFT 23 and the other TFT).

Figure 16:
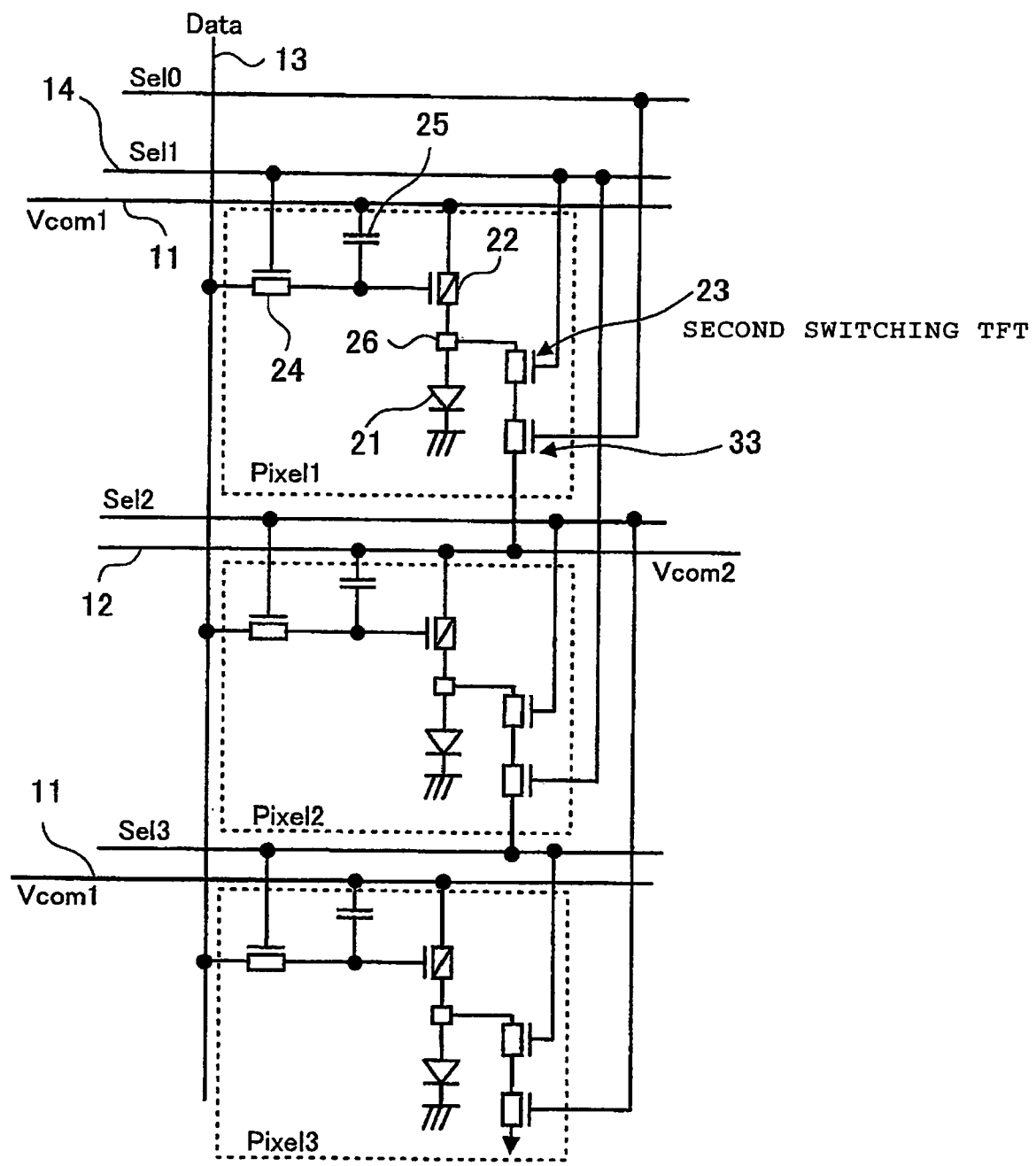
FIG. 16 is a diagram showing an example in which this embodiment is applied to pixel circuits (Brody's circuit) of the voltage programming system composed of two TFTs.

FIG. 16 is a diagram showing an example in which this embodiment is applied to the pixel circuits (Brody's circuit) of the voltage programming system composed of two TFTs. Here, a second switching TFT 33, which is a second connection switch, is provided in series to the switching TFT 23, which is a first connection switch, thus configuring an AND circuit. The gate of the switching TFT 23 is connected to the select line 14 of the concerned pixel, and the gate of the second switching TFT 33 is connected to the select line 14 located therebefore. When only the switching TFT 23 is provided as the connection switch, the connection switch (switching TFT 23) is turned ON during the programming. Therefore, the same current as that when the OLED 21 is fully turned on is flown therethrough, and the luminance is increased momentarily. Consequently, the contrast is lowered, causing the lowered display quality. In order to prevent this, a configuration is made such that two connection switches are connected in series, the gate of the switching TFT 23, that is the first connection switch, is connected to the select line 14 of the selected pixel, and the gate of the second switching TFT 33, that is the second connection switch, is connected to the select line 14 located therebefore.

In the normal operation as shown in FIG. 3, only one select pulse is flown, and accordingly, two select lines 14 are not selected simultaneously. Hence, the connection switches (the switching TFT 23 and the second switching TFT 33) connected in series are not turned ON simultaneously, and a large current is not flown in the OLED 21 during the programming. Hence, at the time of the inspection, two select pulses are flown continuously, and thus the connection switches are set in the ON state. In this case, one of the first common wiring (Vcom1) 11 and the second common wiring (Vcom2) 12 is set at the power source potential, and the other is set at the GND potential.

Figure 17:
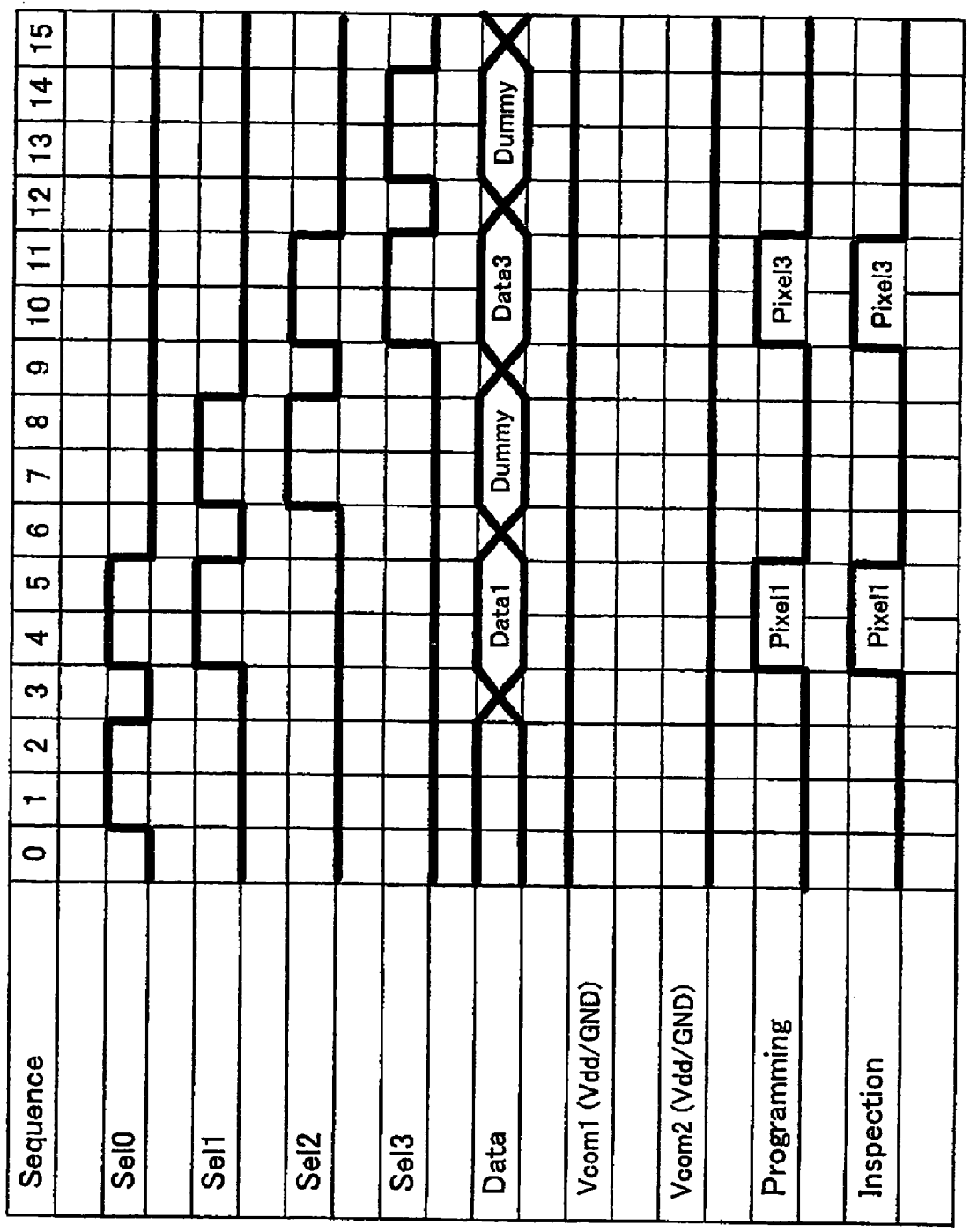
FIG. 17 is a chart showing an example of drive waveforms in the case of inspecting a circuit in FIG. 16.

FIG. 17 is a chart showing an example of drive waveforms in the case of inspecting the circuit shown in FIG. 16. The inspection is performed in a state where the first common wiring (Vcom1) 11 is set at the power source potential and the second common wiring (Vcom2) 12 is set at the GND potential. The pixels of the odd-numbered lines can be inspected by the drive waveforms shown in FIG. 17. In this case, a current is not observed if an OFF potential of the drive TFT 22 is written as data to each pixel of the even-numbered lines. However, even if an ON potential is written, a current flowing in the drive TFT 22 in a reverse direction is only observed, and it is possible to distinguish the current by timing. After the end of the inspection of the odd-numbered lines, the first common wiring (Vcom1) 11 is set at the GND potential, the second common wiring (Vcom2) 12 is set at the power source potential, and a similar operation to the above is repeated. Thus, the pixels of the even-numbered lines can be inspected.

Figure 18:
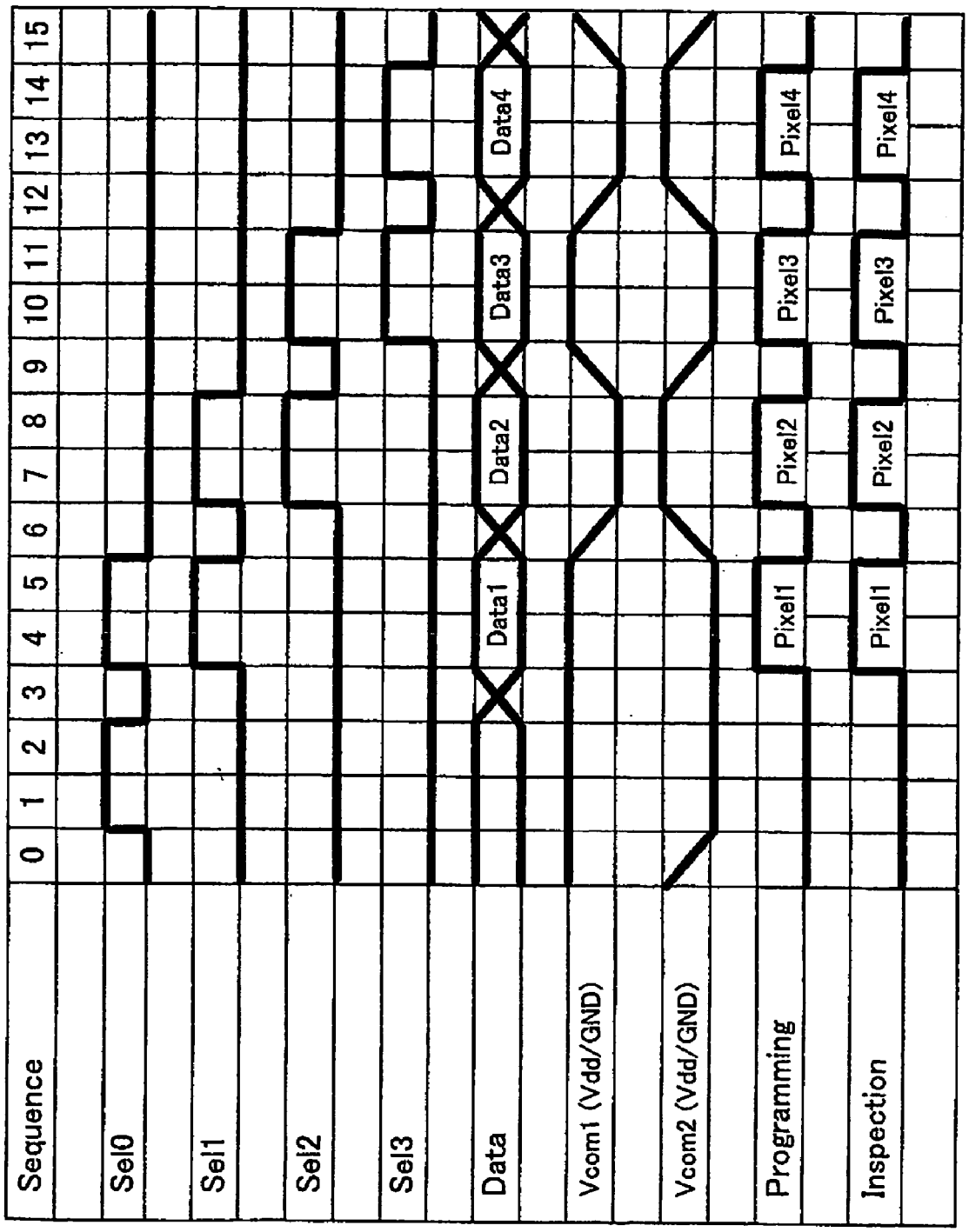
FIG. 18 is a chart showing drive waveforms when the inspection is performed simultaneously with programming in a circuit of Embodiment 4 shown in FIG. 16.

FIG. 18 is a chart showing drive waveforms according to another drive method in the case of inspecting the circuit in FIG. 16. Here also, similarly to the above, two select pulses are flown continuously to set the connection switches in the ON state. However, in this case, as shown in FIG. 18, the first common wiring (Vcom1) 11 and the second common wiring (Vcom2) 12 are switched such that one thereof is set at the power source potential and the other is set at the GND potential every time when the line to be selected is changed. Thus, it is made possible to inspect the pixels sequentially. Note that operation control for the first common wiring (Vcom1) 11 and the second common wiring (Vcom2) 12 is executed by the power control circuits 118 shown in FIG. 6.

Embodiment 5

Different from Embodiment 4, Embodiment 5 has a feature that one connection switch (the switching TFT 23) and a diode 34 are connected in series.

Figure 19:
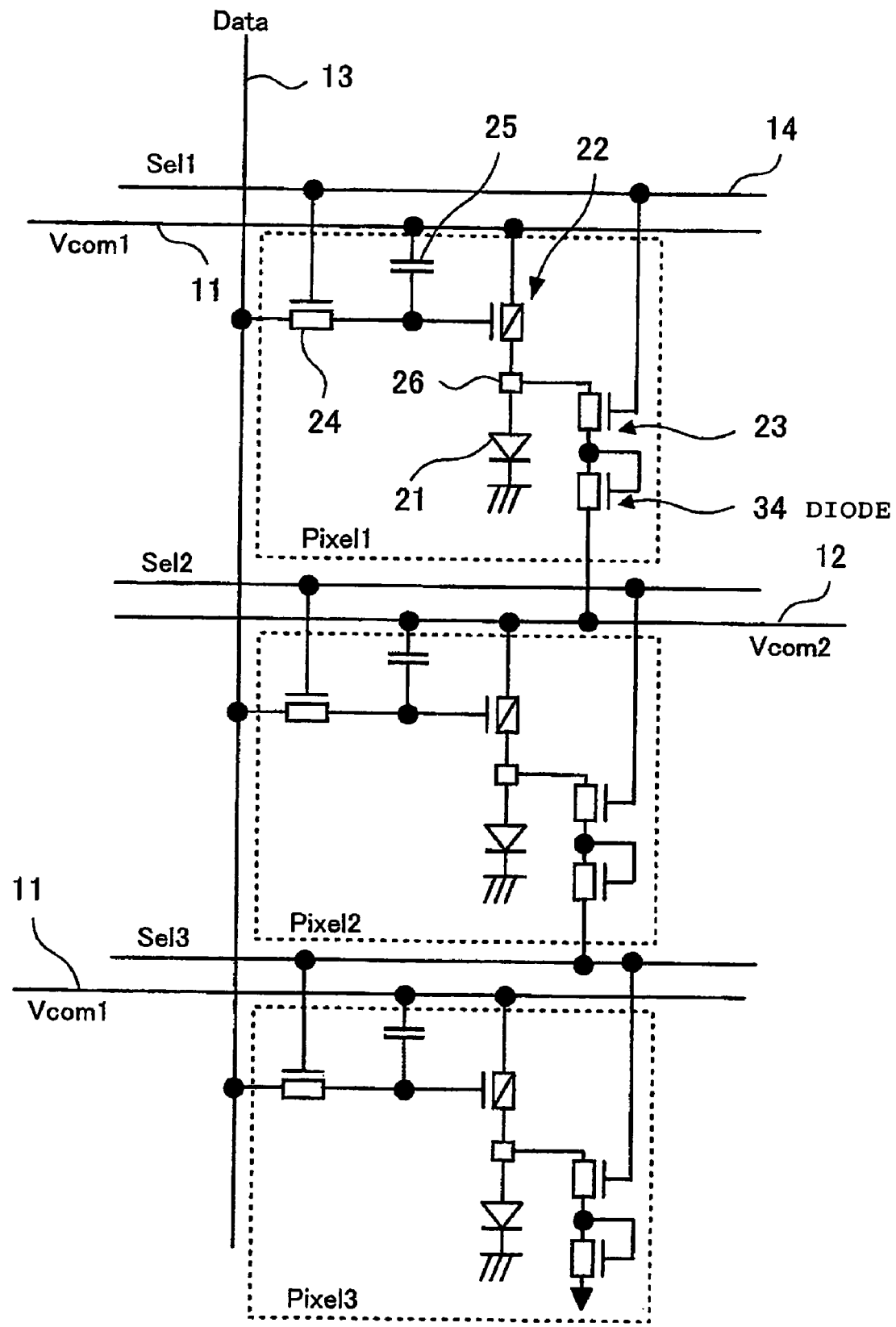
FIG. 19 is a diagram showing an example in which a connection switch and a diode are connected in series.

FIG. 19 is a diagram showing an example in which the switching TFT 23 and the diode 34 are connected in series. FIG. 13 referred to in Embodiment 3 shows the example in which only one diode 32 is connected. In the case of the example shown in FIG. 13, as shown in the sequences of FIGS. 14 and 15, the OFF potential has had to be programmed for lighting off after the inspection of the selected pixels. Meanwhile, this embodiment shown in FIG. 19 has a feature that the diode 34 is connected in series to the switching TFT 23 and a function for securely separating the connected portion without depending on the state of the data of the pixel for which the inspection has been ended is added. The gate of the switching TFT 23 is connected to the select line 14 of the selected pixel, thus enabling the switching by the select pulse and facilitating the inspection sequence more. Moreover, as compared to Embodiment 4, though the number of TFTs for use are the same, the number of wiring can be reduced, and layout of the pixel circuits becomes simpler.

The circuit shown in FIG. 19 is driven by a similar method to that shown in FIG. 3 at the time of the normal drive. At the time of the inspection, the circuit is driven in a state where one of the first common wiring (Vcom1) 11 and the second common wiring (Vcom2) 12 is set at the power source potential and the other is set at the GND potential. The drive waveforms when the current is measured in the circuit shown in FIG. 19 are the same as those in FIG. 5. For example, when the first common wiring (Vcom1) 11 is set at the power source potential and the second common wiring (Vcom2) 12 is set at the GND potential, the odd-numbered lines such as Sel1 and Sel3 in the select lines 14 can be inspected. After this operation, a similar operation is repeated in a state where the first common wiring (Vcom1) 11 is set at the GND potential and the second common wiring (Vcom2) 12 is set at the power source potential, and thus the even-numbered lines can be inspected.

The waveforms in the case of measuring the potentials of the first common wiring (Vcom1) 11 and second common wiring (Vcom2) 12 while alternately switching the potentials such that one thereof is set at the power source potential and the other is set at the GND potential are the same as those in FIG. 4. In such a case, different from the waveforms shown in FIG. 14, the connection for the inspection can be cut off by the switching TFT 23, which is a connection switch. Accordingly, the programming for lighting off is not needed. Therefore, the measurement can be performed at high speed. Note that it is satisfactory if the switching TFT 23 and the diode 34 are connected in series, and positions thereof may be reversed. Moreover, the gate of the switching TFT 23 may be connected to the select line 14 located therebefore or thereafter. In such a case, it is necessary to change a way of giving the select pulses.

Embodiment 6

In Embodiment 6, description will be made for the case where the present invention is applied to the Dawson's circuit, which is shown in FIG. 23(b).

Figure 20:
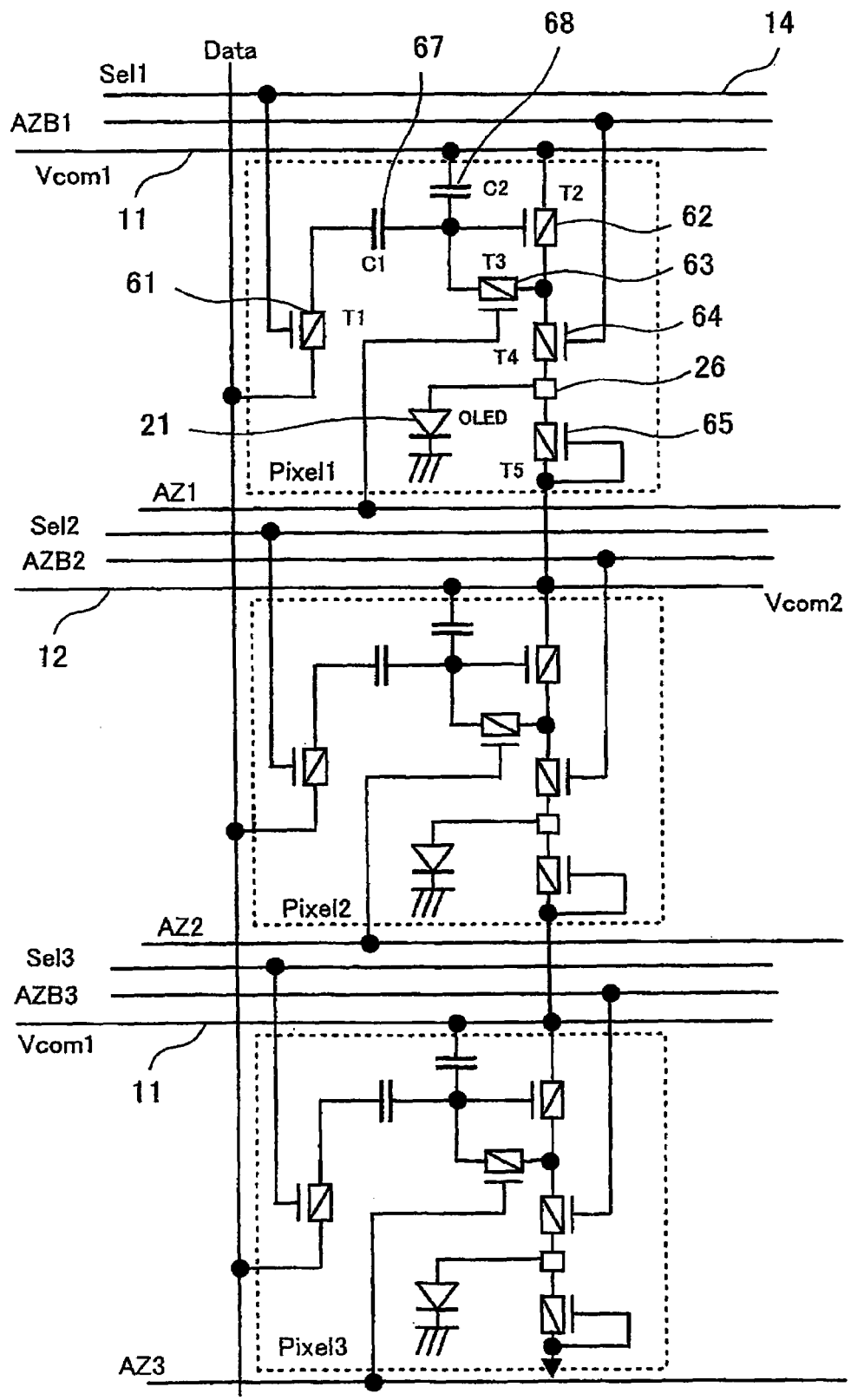
FIG. 20 is a circuit diagram in the case where the present invention is applied to a Dawson's circuit.

FIG. 20 shows a circuit diagram in the case where the present invention is applied to the Dawson's circuit. Here, five TFTs, a selecting TFT (T1) 61, a drive TFT (T2) 62, a Vt correcting TFT (T3) 63, a current controlling TFT (T4) 64, and an inspecting connection switch (T5) 65, are provided to drive the OLED 21. Moreover, a pixel capacitor (C1) 67 and a pixel capacitor (C2) 68 are provided. Similarly to Embodiments 1 to 5 mentioned above, in Embodiment 6, the common wiring is separated into two lines of the first common wiring (Vcom1) 11 and the second common wiring (Vcom2). Moreover, the inspecting connection switch (T5) 65 is connected in series to the drive TFT (T2) 62 and the current controlling TFT (T4) 64. By this inspecting connection switch (T5) 65, an inspecting current path is given to the drive TFT (T2) 62. Similarly to Embodiments 2, 3, 4 and 5, it is also possible that the gate of the inspecting connection switch (T5) 65 is connected to the other select line 14, that a plurality of the inspecting connection switches (T5) 65 are arranged in series, or that the diode and the inspecting connection switch (T5) 65 are arranged in series.

Embodiment 7

In Embodiment 7, description will be made for the case where the present invention is applied to the Dawson's circuit, which is shown in FIG. 23(c).

Figure 21:
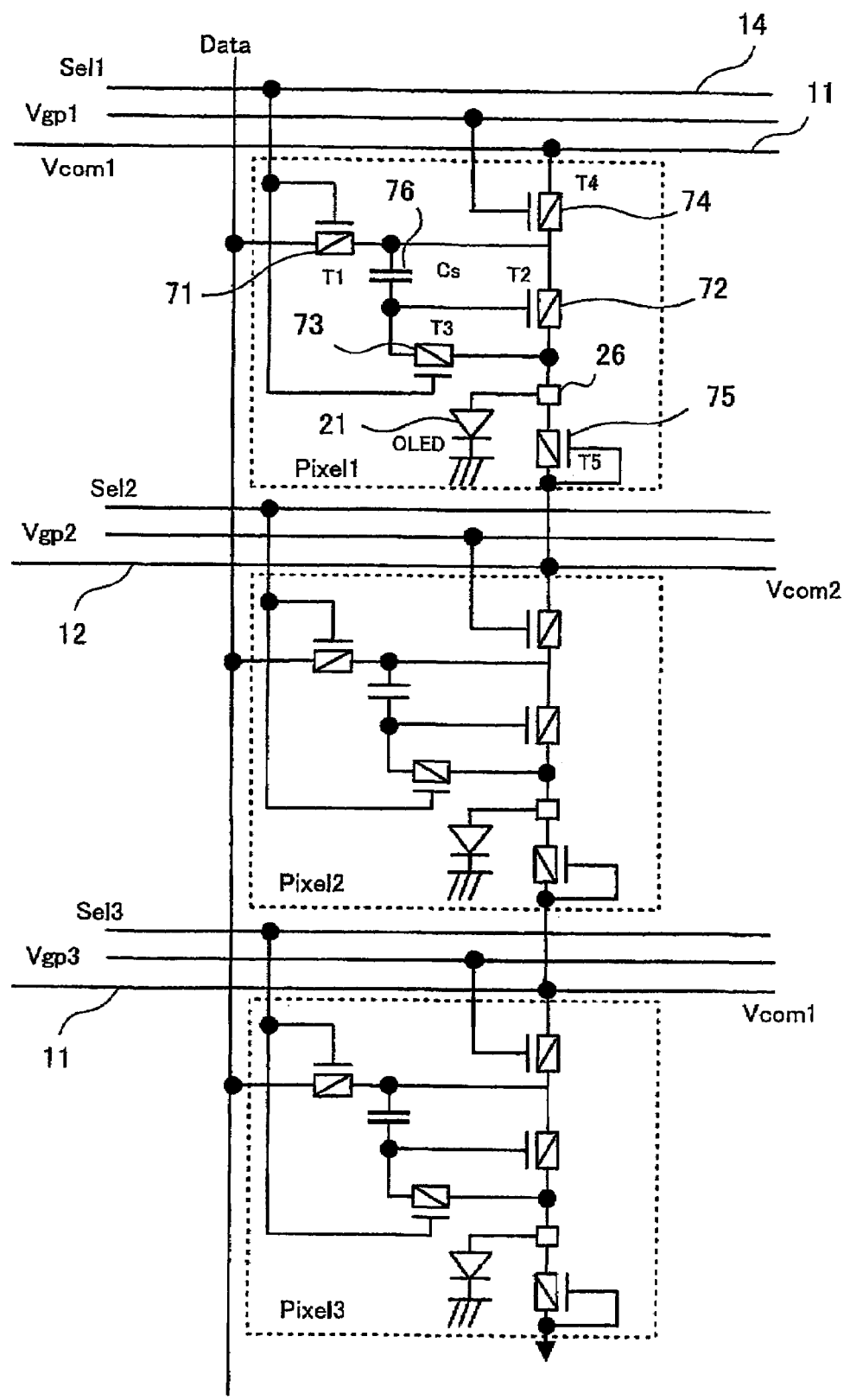
FIG. 21 is a circuit diagram in the case where the present invention is applied to the Dawson's circuit.

FIG. 21 shows a circuit diagram in the case where the present invention is applied to the Dawson's circuit. Here, among five TFTs 71 to 75 also denoted by reference symbols T1 to T5, the inspecting connection switch (T5) 75 is connected in series to the drive TFT (T2) 72. Moreover, a pixel capacitor (Cs) 76 is provided. Similarly to Embodiments mentioned above, the common wiring is separated into two lines of the first common wiring (Vcom1) 11 and the second common wiring (Vcom2) 12, and an inspecting current path is given to the drive TFT (T2) 72 by the inspecting connection switch (T5) 75. Similarly to Embodiments 2, 3, 4 and 5, the gate of the inspecting connection switch (T5) 75 may be connected to the other select line 14, a plurality of the inspecting connection switch (T5) 75 may be connected in series, or the diode and the inspecting connection switch (T5) 75 may be connected in series.

Embodiment 8

In Embodiment 8, description will be made for the case where the present invention is applied to the pixel circuit composed of four TFTs of the current mirror system shown in FIG. 23(d).

Figure 22:
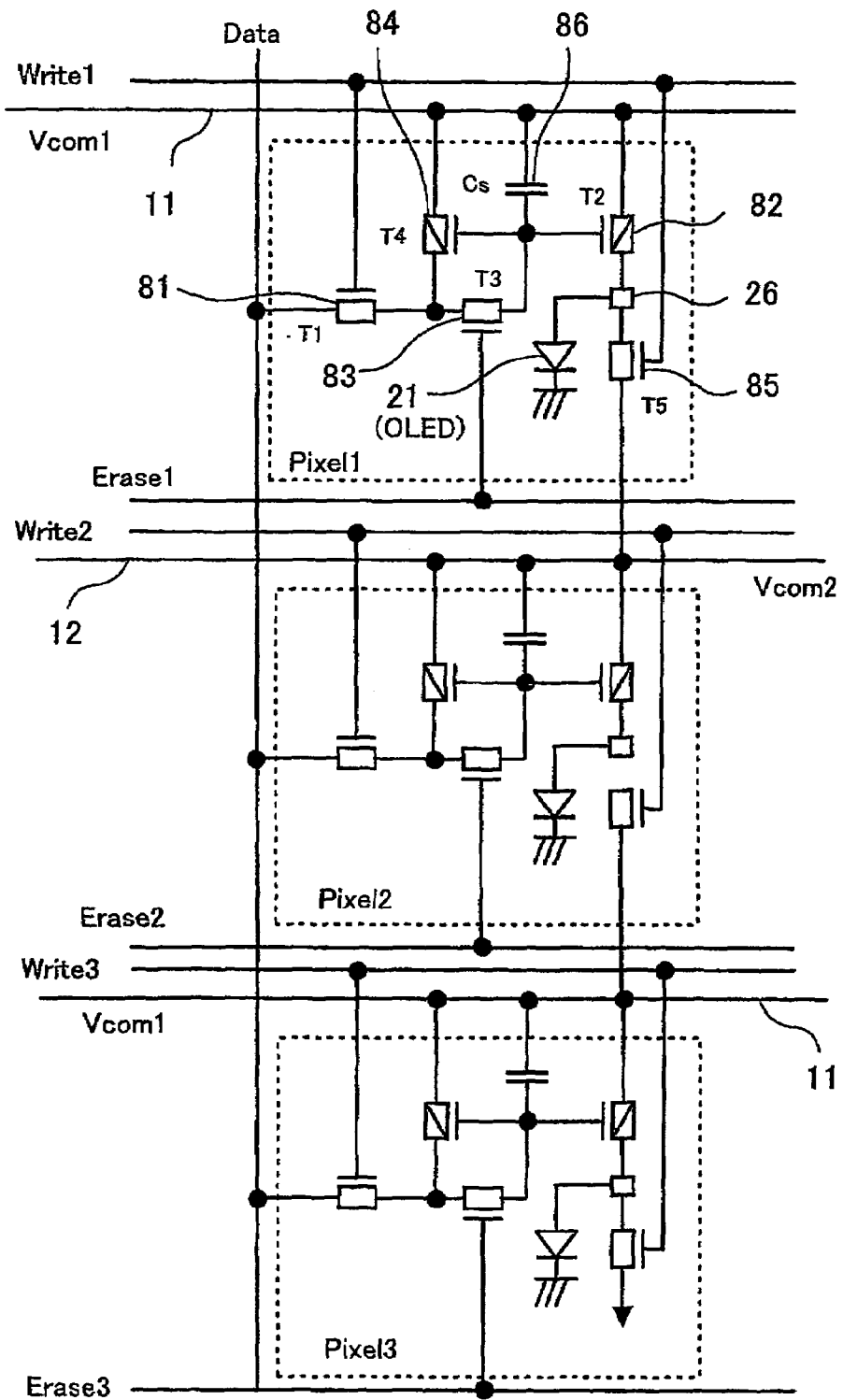
FIG. 22 is a circuit diagram in the case where the present invention is applied to a pixel circuit composed of four TFTs of a current mirror system.

FIG. 22 shows a circuit diagram in the case where the present invention is applied to the pixel circuit composed of four TFTs of the current mirror system. Here, among five TFTs 81 to 85 also denoted by reference symbols T1 to T5, the inspecting connection switch (T5) 85 is connected in series to the drive TFT (T2) 82. Moreover, a pixel capacitor (Cs) 86 is provided. Similarly to Embodiments mentioned above, the common wiring is separated into two lines of the first common wiring (Vcom1) 11 and the second common wiring (Vcom2) 12, and an inspecting current path is given to the drive TFT (T2) 82 by the inspecting connection switch (T5) 85. Moreover, similarly to Embodiments 2, 3, 4 and 5, with regard to the inspecting connection switch (T5) 85, it is also possible that the gate thereof is connected to the other write line (Write), that a plurality of the inspecting connection switches (T5) 85 are arranged in series, that the inspecting connection switch is replaced by a diode, or that the diode and the inspecting connection switch (T5) 85 are connected in series.

As described above in detail, in Embodiments 1 to 8, the configurations are adopted, in each of which the common wiring that has conventionally been one piece of wiring is separated into two lines, and the power source or the GND is connected to the pixel circuits by the common wiring alternately different for each of the horizontal lines or of the vertical columns. Then, at the time of inspecting the TFT array 100 (refer to FIG. 6), the different potentials are applied to the two pieces of common wiring, and the current path from one of the common wiring to the other common wiring is configured, thus making it possible to inspect the characteristics of the TFT driving the OLED. According to the methods described in Embodiments 1 to 8, it is not necessary to introduce new inspecting wiring, and accordingly, the layout of the pixel circuits can be less affected. Particularly, in an OLED panel of a bottom emission (backside display) system, it is possible to restrict a reduction of an area of an OLED light emitting portion of each pixel. Moreover, in the OLED panel adopting these methods, for the TFT array alone, it is possible to estimate the parameters such as Vth and P of the TFT driving the OLED and to easily measure the Id-Vgs characteristics and the like, and it is made possible to eliminate defective TFT arrays before implementing the OLED. Specifically, though a state where the OLED 21 is implemented is shown for the sake of facilitating the explanation in each of the circuit diagrams describing Embodiments 1 to 8, it is possible to inspect the TFT driving the OLED even before implementing the OLED 21 according to these embodiments.

Finally, a method for manufacturing the OLED panel as described in Embodiments 1 to 8 will be explained.

The method for manufacturing the OLED panel, to which this embodiment is applied, includes an array step of creating the TFT array 100 (an active matrix panel), which is a drive circuit for the OLED 21, and an inspection step of performing a function test for the created TFT array 100 alone. In this inspection step, video data is programmed in a state where a high potential is supplied to one of the first common wiring (Vcom1) 11 and the second common wiring (Vcom2) 12 in the active matrix panel created in the array step and a low potential is supplied to the other, the current flowing in the drive TFT 22 (62, 72 or 82) is then observed, and thus the inspection is performed. A TFT array 100 determined to be defective in this inspection step is eliminated without being moved to the next step. A TFT array 100 determined to be acceptable passes through a cell step of forming the OLED 21 on the TFT array 100, and is moved to a final inspection step. In this final inspection step, the acceptable ones and the defective ones are distinguished. In this embodiment, the inspection step is provided before the cell step, thus making it possible to eliminate the TFT array 100 in which variations of the drive TFT 22 (62, 72 or 82) are large before mounting the OLED 21 thereon. As subjects to be inspected, for example, besides an active matrix (AM) panel for use in a display screen of a PHS or a cellular phone, a variety of AMOLED panels are given.

As examples of making full use of the present invention, applications thereof to a TFT array for implementing an EL device therein, a display panel in which the EL device is implemented, and the like, are conceivable.

Although the preferred embodiments of the present invention have been described in detail, it should be understood that various changes, substitutions and alternations can be made therein without departing from spirit and scope of the inventions as defined by the appended claims.

What is claimed is:

1. A TFT array comprising:
a drive TFT for driving an EL device;
first common wiring disposed for performing either of a current supply and a current drainage for the EL device;
second common wiring disposed for performing either of a current supply and a current drainage for the EL device, the second common wiring being connected alternately with the first common wiring for either of each horizontal line and each vertical column of a pixel; and
a connection switch for connecting either one of the first common wiring and the second common wiring to a pixel electrode.

2. The TFT array according to claim 1, further comprising select wiring for selecting the pixel,
wherein the connection switch is composed of a TFT, and ON/OFF control of the TFT is performed by use of the select wiring.

3. The TFT array according to claim 1, wherein the connection switch is composed of a TFT, and ON/OFF control of the TFT is performed by use of select wiring prepared for selecting a pixel other than a pixel in which the ON/OFF control of the TFT is performed.

4. The TFT array according to claim 1, wherein the connection switch includes a diode, and a polarity of a terminal of the diode, the terminal being connected to the pixel electrode, coincides with a polarity of a terminal of the EL device, the terminal being connected to the pixel electrode.

5. The TFT array according to claim 1, wherein the connection switch is composed of a plurality of TFTs connected in series, and ON/OFF control of the plurality of TFTs is performed by use of a pair of select wiring prepared for selecting a pixel in which the ON/OFF control of the TFTs is performed and select wiring prepared for selecting a pixel other than the pixel or the select wiring prepared for selecting the pixel other than the pixel in which the ON/OFF control of the TFTs is performed.

6. A TFT array comprising:
a drive TFT for driving an EL device;
first common wiring disposed for performing either of a current supply and a current drainage for the EL device;
second common wiring disposed for performing either of a current supply and a current drainage for the EL device, the second common wiring being connected alternately with the first common wiring for either of each horizontal line and each vertical column of a pixel; and
means for enabling an inspection of the drive TFT by supplying a high potential to either one of the first common wiring and the second common wiring and a low potential to the other.

7. The TFT array according to claim 6, wherein, after performing a current measurement of the drive TFT in a pixel in either one of an odd-numbered array and an even-numbered array, the means for enabling an inspection of the drive TFT mutually switches the potentials of the first common wiring and second common wiring, and enables a current measurement of the drive TFT in a pixel in the other of the odd-numbered array and the even-numbered array.

8. The TFT array according to claim 6, wherein the means for enabling an inspection of the drive TFT enables the inspection of the drive TFT while alternately switching the potential of the first common wiring and the potential of the second common wiring for each pixel inspection.

9. A display panel comprising:
an EL device;
a drive TFT for driving the EL device;
first common wiring disposed for performing either of a current supply and a current drainage for the EL device;
second common wiring disposed for performing either of a current supply and a current drainage for the EL device, the second common wiring being connected alternately with the first common wiring for either of each horizontal line and each vertical column of a pixel; and
a connection switch for connecting either one of the first common wiring and the second common wiring to a pixel electrode.

10. The display panel according to claim 9, wherein the connection switch is composed either of a single TFT and a plurality of TFTs connected in series, and ON/OFF control thereof is performed by use of a select line for selecting a pixel.

11. The display panel according to claim 10, wherein the ON/OFF control of the TFTs composing the connection switch is performed by use of the select line prepared for selecting the pixel in which the ON/OFF control of the TFTs is performed and/or the select line prepared for selecting a pixel other than the pixel.

12. The display panel according to claim 9, wherein the connection switch includes a diode, and a polarity of a terminal of the diode, the terminal being connected to the pixel electrode, coincides with a polarity of a terminal of the EL device, the terminal being connected to the pixel electrode.

13. The display panel according to claim 9, wherein the first common wiring and the second common wiring are supplied with potentials equal to each other at a time of a normal operation performing image display.

14. A method for inspecting a TFT array of pixels comprising:
providing a drive TFT for driving an EL device, in which common wiring to be implemented therein is separated into first common wiring and second common wiring,
connecting first common wiring and the second common wiring alternately with each other for either of each horizontal line and each vertical column of a pixel,
applying a high potential to either one of the first common wiring and the second common wiring, and applyng a low potential to the other, and
measuring a drive current flowing in the drive TFT from the one of the first common wiring and the second common wiring to the other.

15. The method for inspecting a TFT array according to claim 14, wherein, after measuring the drive current, switching application of the low potential to the one of the first common wiring and the second common wiring and switching application of the high potential to the other, and measuring the drive current flowing in the drive TFT.

16. The method for inspecting a TFT array according to claim 15, wherein the switching application of the low and high potentials of the first common wiring and second common wiring is performed for each pixel inspection.

17. The method for inspecting a TFT array according to claim 15, wherein the switching application of the low and high potentials of the first common wiring and second common wiring is performed after a measurement of a drive current for a drive TFT of either of an even-numbered pixel and an odd-numbered pixel.

18. A method for manufacturing an active matrix OLED (organic light emitting diode) panel, comprising:

an array step of creating an active matrix having a TFT array including a drive TFT for driving the OLED, in which common wiring to be implemented therein is separated into first common wiring and second common wiring, and the first common wiring and the second common wiring are connected alternately with each other for either of each horizontal line and each vertical column;

an inspection step of inspecting a function of the created active matrix panel; and a cell step of implementing the OLED for an active matrix panel determined to be acceptable in the inspection step, wherein, in the inspection step, video data is programmed in a state where a high potential is supplied to either one of the first common wiring and the second common wiring in the active matrix panel created in the array step and a low potential is supplied to the other, and the inspection is performed by observing a current flowing in the drive TFT.

19. The method for manufacturing an active matrix OLED panel according to claim 18, wherein, in the array step, an active matrix having a TFT array in which either one of the first common wiring and the second common wiring is connected to the drive TFT either directly and through another circuit and the other is connected to a pixel electrode through a connection switch is created.

* * * * *